United States Patent
Omoto

(10) Patent No.: US 8,581,275 B2
(45) Date of Patent: Nov. 12, 2013

(54) ORGANIC EL DISPLAY AND ELECTRONIC APPARATUS

(75) Inventor: Keisuke Omoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 5 days.

(21) Appl. No.: 13/305,308

(22) Filed: Nov. 28, 2011

(65) Prior Publication Data

US 2012/0187425 A1   Jul. 26, 2012

(30) Foreign Application Priority Data

Jan. 25, 2011   (JP) .................. 2011-013049

(51) Int. Cl.
*H01L 27/32* (2006.01)
*H01L 51/52* (2006.01)

(52) U.S. Cl.
USPC ........... 257/91; 257/40; 257/89; 257/E27.119

(58) Field of Classification Search
None
See application file for complete search history.

(56) References Cited

U.S. PATENT DOCUMENTS

| | | | | |
|---|---|---|---|---|
| 7,399,993 B2 * | 7/2008 | Matsuda | | 257/89 |
| 7,723,735 B2 * | 5/2010 | Matsuda | | 257/88 |
| 7,902,749 B2 * | 3/2011 | Chen et al. | | 313/506 |
| 8,040,052 B2 * | 10/2011 | Kobayashi | | 313/506 |
| 2005/0225232 A1 * | 10/2005 | Boroson et al. | | 313/504 |
| 2007/0090340 A1 * | 4/2007 | Lee | | 257/28 |
| 2009/0242911 A1 * | 10/2009 | Ishihara et al. | | 257/89 |
| 2009/0256168 A1 * | 10/2009 | Taneda et al. | | 257/98 |
| 2009/0309108 A1 * | 12/2009 | Chang et al. | | 257/89 |
| 2010/0314644 A1 * | 12/2010 | Nishimura et al. | | 257/98 |
| 2011/0049483 A1 * | 3/2011 | Nishimura et al. | | 257/40 |
| 2011/0114929 A1 * | 5/2011 | Fujita et al. | | 257/40 |
| 2011/0127505 A1 * | 6/2011 | Nakamura et al. | | 257/40 |
| 2011/0127906 A1 * | 6/2011 | Mitsuya et al. | | 313/504 |
| 2011/0303903 A1 * | 12/2011 | Yoshinaga et al. | | 257/40 |

FOREIGN PATENT DOCUMENTS

JP   2003-123971   4/2003

\* cited by examiner

*Primary Examiner* — Thomas L Dickey
*Assistant Examiner* — Joseph Schoenholtz
(74) *Attorney, Agent, or Firm* — Rader, Fishman & Grauer PLLC

(57) ABSTRACT

Disclosed herein is an organic EL display device in which pixels each including an organic EL element formed by interposing an organic layer between an anode electrode and a cathode electrode are arranged in a matrix, the organic EL display device including: a common layer configured to be included in the organic EL element and be formed in the organic layer in common to the pixels; and a metal interconnect configured to surround periphery of the anode electrode and be electrically connected to the organic layer, wherein potential of the metal interconnect is set to a potential lower than potential of the anode electrode in a non-light-emission state of the organic EL element.

13 Claims, 19 Drawing Sheets

BEFORE $t=t_{11}$ $t=t_{11}$ $t=t_{12}$ $t=t_{13}$

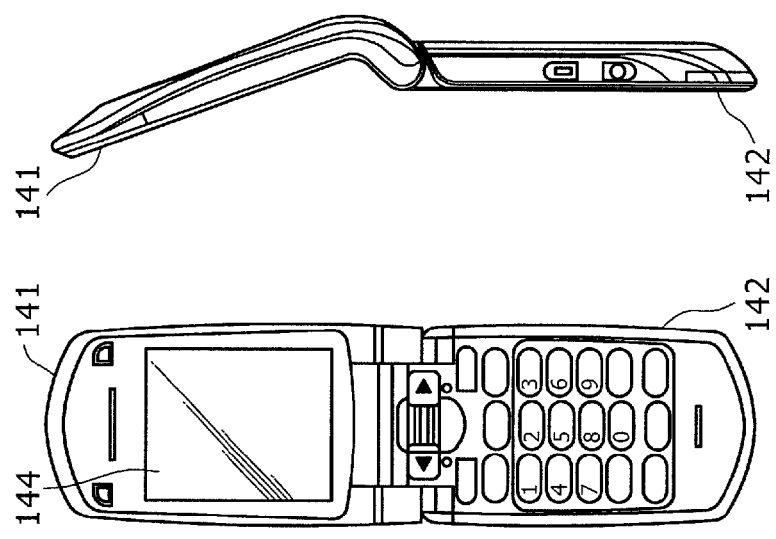
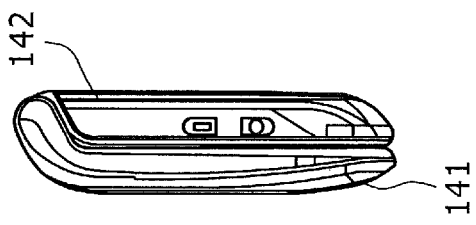
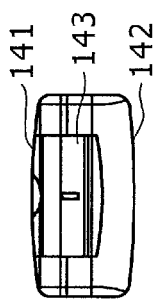
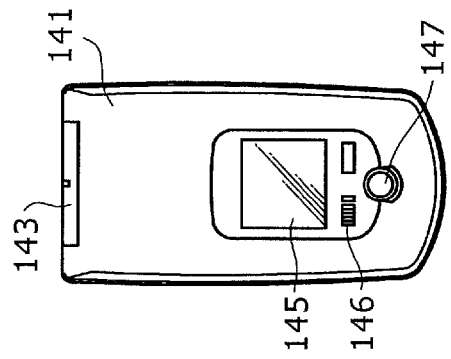
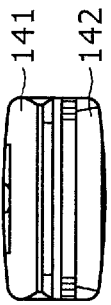
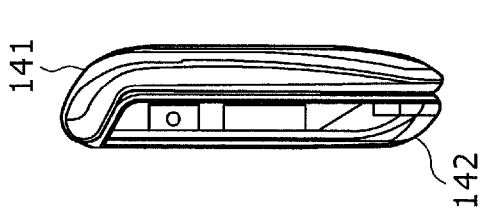

ORGANIC EL DISPLAY AND ELECTRONIC APPARATUS

BACKGROUND

The present disclosure relates to an organic EL display device and electronic apparatus.

As one of planar type (flat panel type) display devices, there is a display device in which a so-called current-driven electrooptical element whose light emission luminance changes depending on the value of the current flowing through the element is used as a light emitter (light emitting element) of the pixel. As the current-driven electrooptical element, an organic EL element is known. The organic EL element utilizes electroluminescence (EL) of an organic material and uses a phenomenon in which an organic thin film emits light when an electric field is applied thereto.

The organic EL display device using the organic EL element as the light emitter of the pixel has the following features. Specifically, the organic EL element has low power consumption because it can be driven by an applied voltage of 10 V or lower. The organic EL element is a self-luminous element and therefore provides high image visibility compared with a liquid crystal display device. In addition, the organic EL element easily allows reduction in the weight and thickness of the display device because it does not require an illuminating component such as a backlight. Moreover, the organic EL element has a very high response speed of several microseconds and therefore a residual image in moving image displaying does not occur.

As the organic EL display device, a display device of a so-called RGB mask separate-application system obtained by separately applying organic EL materials of red (R), green (G), and blue (B) by evaporation with use of a mask is generally known. In contrast, there is a display device that is obtained without the RGB mask separate-application and is based on a system in which the respective color light beams of RGB are obtained by the combination of an organic EL element that emits white light (hereinafter, referred to as "white organic EL element") and a color filter for the purpose of increase in the size and definition of the display device (refer to e.g. Japanese Patent Laid-open No. 2003-123971).

SUMMARY

In the above-described organic EL display device based on the combination of the white organic EL element and the color filter, a common layer formed in common to the respective pixels exists. The existence of the common layer among the pixels causes the following problem. Specifically, leakage to a pixel that adjoins occurs through this common layer and the pixel that adjoins (hereinafter, referred to as "adjacent pixel") also emits light slightly due to this leakage. Therefore, the color reproducibility (color purity) is deteriorated.

This problem is not limited to the organic EL display device based on the combination of the white organic EL element and the color filter. Specifically, the same problem occurs also in e.g. an organic EL display device of the mask separate-application system as long as a common layer exists among the pixels because leakage to the adjacent pixel occurs through this common layer.

There is a need for a technique to provide an organic EL display device capable of eliminating the problem of leakage to the adjacent pixel to achieve favorable color reproducibility (color purity) and electronic apparatus having this organic EL display device.

According to one embodiment of the present disclosure, there is provided an organic EL display device in which pixels each including an organic EL element formed by interposing an organic layer between an anode electrode and a cathode electrode are arranged in a matrix. The organic EL display device includes a common layer configured to be included in the organic EL element and be formed in the organic layer in common to the pixels, and a metal interconnect configured to surround the periphery of the anode electrode and be electrically connected to the organic layer. The potential of the metal interconnect is set to a potential lower than the potential of the anode electrode in the non-light-emission state of the organic EL element.

In the organic EL display device having the above-described configuration, the metal interconnect electrically connected to the organic layer is formed around the anode electrode. Due to this feature, even when a leakage current flows in the lateral direction through the common layer in the organic layer, this leakage current flows to the metal interconnect side. This can reduce the leakage current flowing into an adjacent pixel and thus suppress light emission in the adjacent pixel.

According to the embodiment of the present disclosure, light emission in the adjacent pixel can be suppressed even when a leakage current flows in the lateral direction through the common layer in the organic layer. Thus, favorable color reproducibility (color purity) can be achieved.

BRIEF DESCRIPTION OF THE DRAWINGS

FIG. 16A is a perspective view of the front side and FIG. 16B is a perspective view of the back side;

FIGS. 19A to 19G are appearance diagrams showing a cellular phone to which one embodiment of the present disclosure is applied: FIG. 19A is a front view of the opened state, FIG. 19B is a side view of the opened state, FIG. 19C is a front view of the closed state, FIG. 19D is a left side view, FIG. 19E is a right side view, FIG. 19F is a top view, and FIG. 19G is a bottom view.

DETAILED DESCRIPTION OF THE PREFERRED EMBODIMENT

A mode for carrying out the technique of the present disclosure (hereinafter, referred to as "embodiment") will be described in detail below with reference to the drawings. The order of the description is as follows.
1. Organic EL Display Device to which Embodiment of Present Disclosure is Applied
1-1. System Configuration
1-2. Basic Circuit Operation
1-3. System of Combination of White Organic EL Element and Color Filter
1-4. Problem of Leakage Current Due to Existence of Common Layer
2. Description of Embodiment
2-1. Pixel Structure to Reduce Leakage Current
2-2. Operation and Effect of Embodiment
3. Modification Example
4. Application Examples (Electronic Apparatus)

1. Organic EL Display Device to which Embodiment of Present Disclosure is Applied

[1-1. System Configuration]

Figure 1:
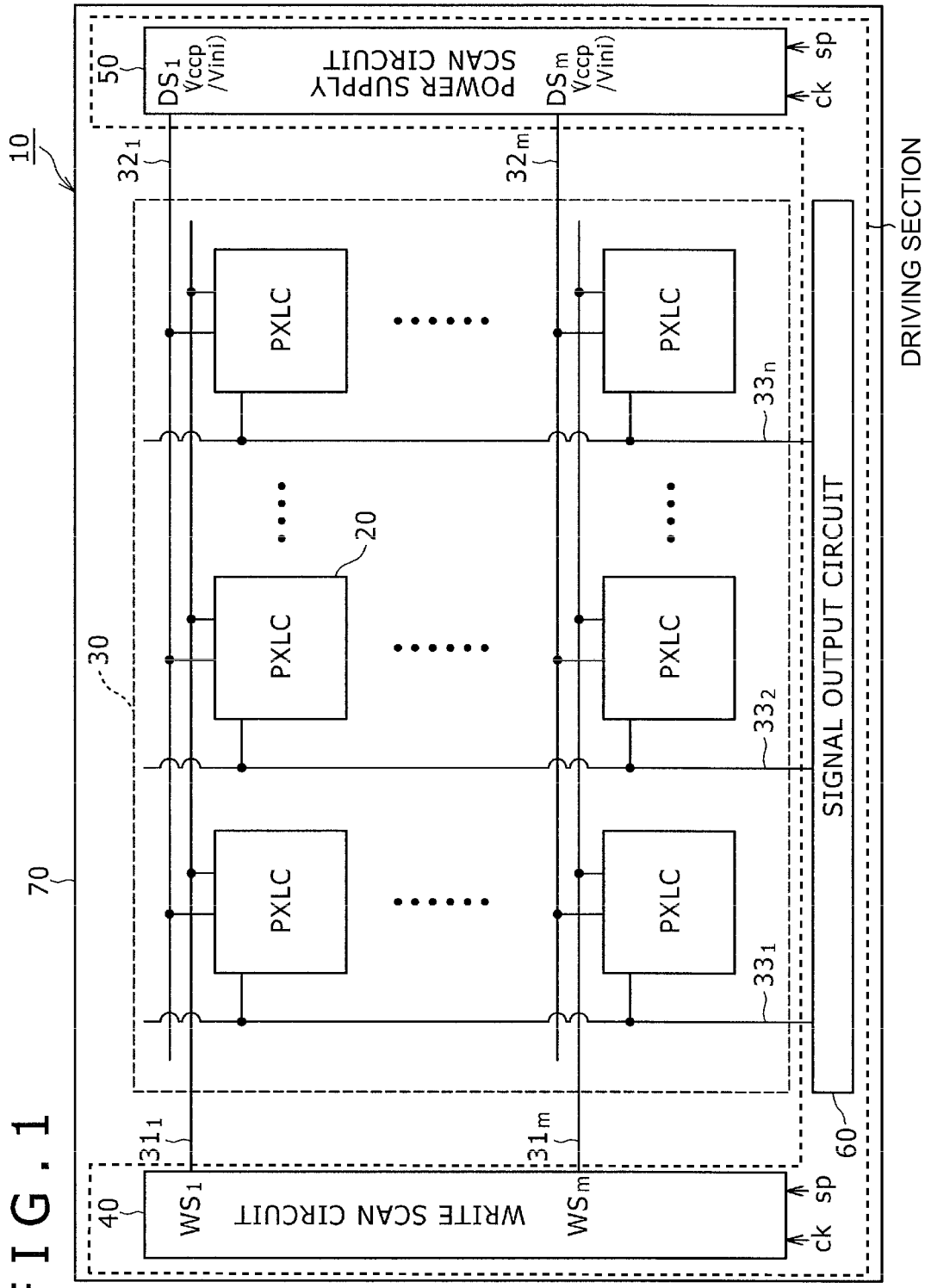
FIG. 1 is a system configuration diagram showing the schematic configuration of an active-matrix organic EL display device to which one embodiment of the present disclosure is applied.

FIG. 1 is a system configuration diagram showing the schematic configuration of an active-matrix organic EL display device to which one embodiment of the present disclosure is applied.

The active-matrix organic EL display device is a display device that controls the current flowing through an organic EL element, which is a current-driven electrooptical element, by an active element provided in the same pixel as that of this organic EL element, e.g. an insulated-gate field effect transistor. As the insulated-gate field effect transistor, typically a thin film transistor (TFT) is used.

As shown in FIG. 1, an organic EL display device 10 according to the present application example has plural pixels 20 each including an organic EL element, a pixel array section 30 in which these pixels 20 are two-dimensionally arranged in a matrix, and a drive circuit section disposed around this pixel array section 30. The drive circuit section is composed of a write scan circuit 40, a power supply scan circuit 50, a signal output circuit 60, and so forth and drives the respective pixels 20 of the pixel array section 30.

If the organic EL display device 10 is for color displaying, one pixel serving as the unit to form a color image (unit pixel) is composed of plural sub-pixels and each of the sub-pixels is equivalent to the pixel 20 in FIG. 1. Specifically, in the display device for color displaying, one pixel is composed of e.g. three sub-pixels, a sub-pixel to emit red (R) light, a sub-pixel to emit green (G) light, and a sub-pixel to emit blue (B) light.

However, the configuration of one pixel is not limited to the combination of sub-pixels of three primary colors of RGB and it is also possible to configure one pixel by further adding a sub-pixel of one color or plural colors to the sub-pixels of three primary colors. Specifically, for example it is also possible to configure one pixel by adding a sub-pixel to emit white (W) light for luminance enhancement and to configure one pixel by adding at least one sub-pixel to emit complementary-color light for widening of the color reproduction range.

In the pixel array section 30, for the arrangement of the pixels 20 on m rows and n columns, scan lines $31_1$ to $31_m$ and power supply lines $32_1$ to $32_m$ are wired along the row direction (arrangement direction of the pixels on the pixel row) on each pixel row basis. Furthermore, for the arrangement of the pixels 20 on m rows and n columns, signal lines $33_1$ to $33_n$ are wired along the column direction (arrangement direction of the pixels on the pixel column) on each pixel column basis.

Each of the scan lines $31_1$ to $31_m$ is connected to the output terminal of the write scan circuit 40 for the corresponding row. Each of the power supply lines $32_1$ to $32_m$ is connected to the output terminal of the power supply scan circuit 50 for the corresponding row. Each of the signal lines $33_1$ to $33_n$ is connected to the output terminal of the signal output circuit 60 for the corresponding column.

The pixel array section 30 is normally formed on a transparent insulating substrate such as a glass substrate. Thus, the organic EL display device 10 has a planar type (flat type) panel structure. The drive circuits of the respective pixels 20 of the pixel array section 30 can be formed by using an amorphous silicon TFT or a low-temperature poly-silicon TFT. If a low-temperature poly-silicon TFT is used, the write scan circuit 40, the power supply scan circuit 50, and the signal output circuit 60 can also be mounted on a display panel (substrate) 70, which forms the pixel array section 30, as shown in FIG. 1.

The write scan circuit 40 is configured with a shift register circuit that sequentially shifts (transfers) a start pulse sp in synchronization with a clock pulse ck, and so forth. In writing of the signal voltage of a video signal to the respective pixels 20 of the pixel array section 30, this write scan circuit 40 sequentially supplies a write scan signal WS ($WS_1$ to $WS_m$) to the scan line 31 ($31_1$ to $31_m$) to thereby scan the respective pixels 20 of the pixel array section 30 in turn on a row-by-row basis (line-sequential scanning).

The power supply scan circuit 50 is configured with a shift register circuit that sequentially shifts the start pulse sp in synchronization with the clock pulse ck, and so forth. This power supply scan circuit 50 supplies, to the power supply line 32 ($32_1$ to $32_m$), a supply potential DS ($DS_1$ to $DS_m$) capable of being switched between a first supply potential $V_{ccp}$ and a second supply potential $V_{ini}$ lower than the first supply potential $V_{ccp}$ in synchronization with the line-sequential scanning by the write scan circuit 40. As described later, light-emission/non-light-emission of the pixel 20 is controlled by the switching of $V_{ccp}/V_{ini}$ of the supply potential DS.

The signal output circuit 60 selectively outputs a reference voltage $V_{ofs}$ and a signal voltage $V_{sig}$ of the video signal corresponding to luminance information supplied from a signal supply source (not shown) (hereinafter, it will be often referred to simply as "signal voltage"). The reference voltage $V_{ofs}$ is the potential serving as the basis of the signal voltage $V_{sig}$ of the video signal (e.g. potential equivalent to the black level of the video signal) and is used in threshold correction processing to be described later.

The signal voltage $V_{sig}$/reference voltage $V_{ofs}$ output from the signal output circuit 60 is written to the respective pixels 20 of the pixel array section 30 via the signal line 33 ($33_1$ to $33_n$) in units of the pixel row selected by scanning by the write scan circuit 40. That is, the signal output circuit 60 employs the driving form of line-sequential writing to write the signal voltage $V_{sig}$ in units of the row (line).

(Pixel Circuit)

Figure 2:
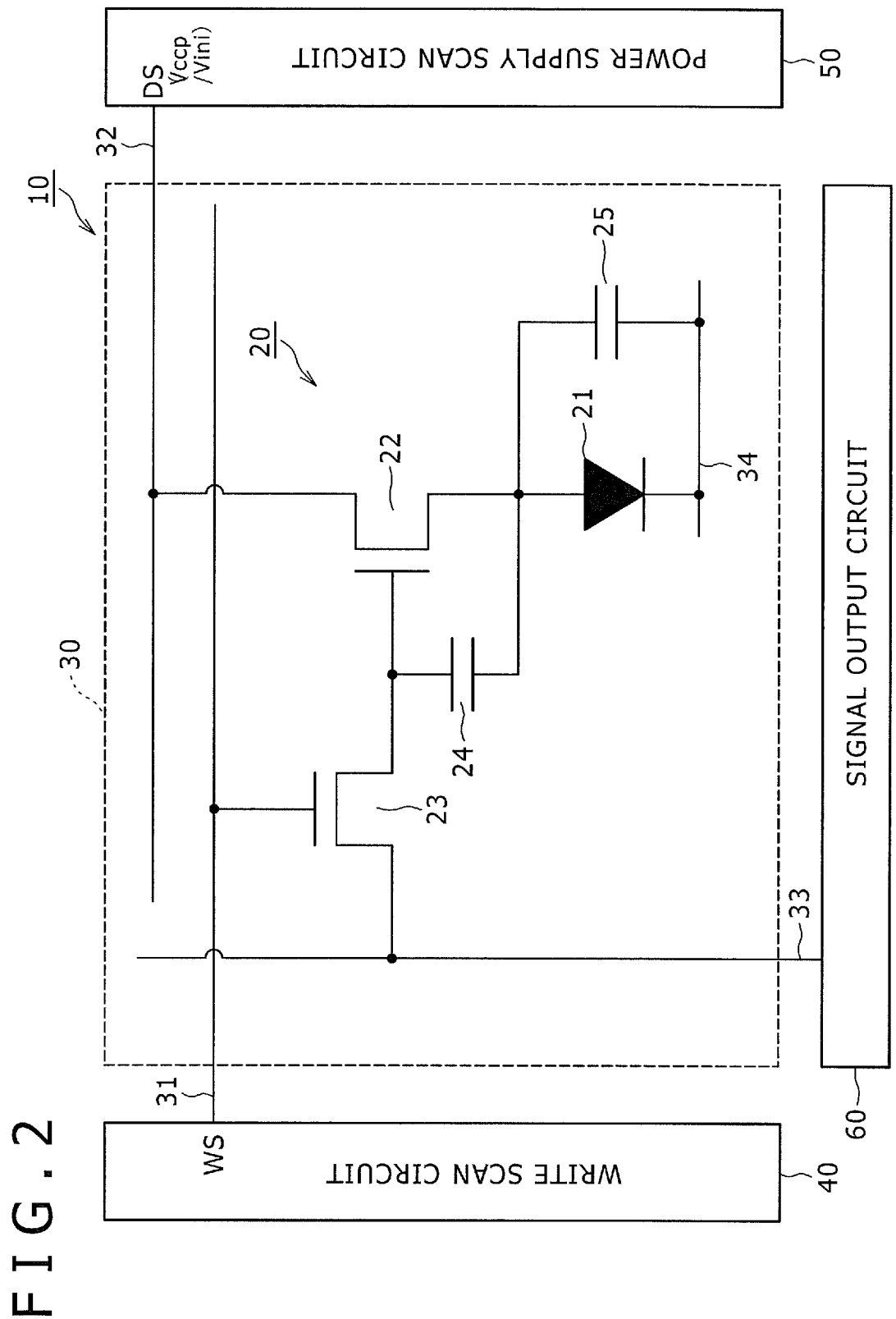
FIG. 2 is a circuit diagram showing one example of the specific circuit configuration of a pixel (pixel circuit)

FIG. 2 is a circuit diagram showing one example of the specific circuit configuration of the pixel (pixel circuit) 20. The light emitter of the pixel 20 is formed of an organic EL element 21, which is a current-driven electrooptical element whose light emission luminance changes depending on the value of the current flowing through the element.

As shown in FIG. 2, the pixel 20 is configured with the organic EL element 21 and the drive circuit that drives the organic EL element 21 by applying a current to the organic EL element 21. The cathode electrode of the organic EL element 21 is connected to a common power supply line 34 wired in common to all pixels 20 (so-called blanket interconnect).

The drive circuit to drive the organic EL element 21 has a drive transistor 22, a write transistor 23, hold capacitance 24, and auxiliary capacitance 25. N-channel TFTs can be used as the drive transistor 22 and the write transistor 23. However, this combination of the conductivity type of the drive transistor 22 and the write transistor 23 is merely one example and the combination of the conductivity type is not limited thereto.

One electrode (source/drain electrode) of the drive transistor 22 is connected to the power supply line 32 ($32_1$ to $32_m$) and the other electrode (drain/source electrode) is connected to the anode electrode of the organic EL element 21.

One electrode (source/drain electrode) of the write transistor 23 is connected to the signal line 33 ($33_1$ to $33_n$) and the other electrode (drain/source electrode) is connected to the gate electrode of the drive transistor 22. The gate electrode of the write transistor 23 is connected to the scan line 31 ($31_1$ to $31_m$).

In the drive transistor 22 and the write transistor 23, one electrode refers to the metal interconnect electrically connected to the source/drain region and the other electrode refers to the metal interconnect electrically connected to the drain/source region. Depending on the potential relationship between one electrode and the other electrode, possibly one electrode serves as either the source electrode or the drain electrode and the other electrode serves as either the drain electrode or the source electrode.

One electrode of the hold capacitance 24 is connected to the gate electrode of the drive transistor 22 and the other electrode is connected to the other electrode of the drive transistor 22 and the anode electrode of the organic EL element 21.

One electrode of the auxiliary capacitance 25 is connected to the anode electrode of the organic EL element 21 and the other electrode is connected to the common power supply line 34. This auxiliary capacitance 25 is provided according to need in order to compensate for insufficiency of the capacitance of the organic EL element 21 and enhance the gain of writing of the video signal to the hold capacitance 24. That is, the auxiliary capacitance 25 is not an essential constituent element and can be omitted if the equivalent capacitance of the organic EL element 21 is sufficiently high.

In this example, the other electrode of the auxiliary capacitance 25 is connected to the common power supply line 34. However, the connection subject of the other electrode is not limited to the common power supply line 34 as long as the connection subject is a node at a fixed potential. Connecting the other electrode of the auxiliary capacitance 25 to the node of a fixed potential allows achievement of the desired purposes of compensating for insufficiency of the capacitance of the organic EL element 21 and enhancing the gain of writing of the video signal to the hold capacitance 24.

In the pixel 20 having the above-described configuration, the write transistor 23 becomes the conductive state in response to the High-active write scan signal WS applied from the write scan circuit 40 to the gate electrode via the scan line 31. Thereby, the write transistor 23 performs sampling of the signal voltage $V_{sig}$ of the video signal corresponding to luminance information or the reference voltage $V_{ofs}$, supplied from the signal output circuit 60 via the signal line 33, and writes it in the pixel 20. This written signal voltage $V_{sig}$ or reference voltage $V_{ofs}$ is applied to the gate electrode of the drive transistor 22 and held in the hold capacitance 24.

When the supply potential DS of the power supply line 32 ($32_1$ to $32_m$) is the first supply potential $V_{ccp}$, one electrode of the drive transistor 22 serves as the drain electrode and the other electrode serves as the source electrode and the drive transistor 22 operates in the saturation region. Thereby, the drive transistor 22 receives supply of a current from the power supply line 32 and drives light emission of the organic EL element 21 based on current driving. Specifically, the drive transistor 22 operates in the saturation region to thereby supply, to the organic EL element 21, a drive current having the current value depending on the voltage value of the signal voltage $V_{sig}$ held in the hold capacitance 24 and make the organic EL element 21 emit light by current driving thereof.

When the supply potential DS is switched from the first supply potential $V_{ccp}$ to the second supply potential $V_{ini}$, one electrode of the drive transistor 22 serves as the source electrode and the other electrode serves as the drain electrode and the drive transistor 22 operates as a switching transistor. Thereby, the drive transistor 22 stops the supply of the drive current to the organic EL element 21 and turns the organic EL element 21 to the non-light-emission state. That is, the drive transistor 22 has also a function as a transistor to control light-emission/non-light-emission of the organic EL element 21.

This switching operation of the drive transistor 22 can set the period during which the organic EL element 21 is in the non-light-emission state (non-light-emission period) and control the ratio between the light-emission period and the non-light-emission period of the organic EL element 21 (duty). By this duty control, the residual image blur accompanying the light emission of the pixel over one display frame period can be reduced and thus particularly the image quality of moving images can be made more excellent.

Of the first and second supply potentials $V_{ccp}$ and $V_{ini}$ selectively supplied from the power supply scan circuit 50 via the power supply line 32, the first supply potential $V_{ccp}$ is a supply potential for supplying the drive current for light emission driving of the organic EL element 21 to the drive transistor 22. The second supply potential $V_{ini}$ is a supply potential for applying a reverse bias to the organic EL element 21. This second supply potential $V_{ini}$ is set to a potential lower than the reference voltage $V_{ofs}$, e.g. a potential lower than $V_{ofs}-V_{th}$ when the threshold voltage of the drive transistor 22 is $V_{th}$, preferably to a potential sufficiently lower than $V_{ofs}-V_{th}$.

[1-2. Basic Circuit Operation]

The basic circuit operation of the organic EL display device 10 having the above-described configuration will be described below based on a timing waveform diagram of FIG. 3 with use of operation explanatory diagrams of FIGS. 4A to 5D. In the operation explanatory diagrams of FIGS. 4A to 5D, the write transistor 23 is shown by a switch symbol for simplification of the drawings. Furthermore, the auxiliary capacitance 25 of the organic EL element 21 is also shown.

Figure 3:
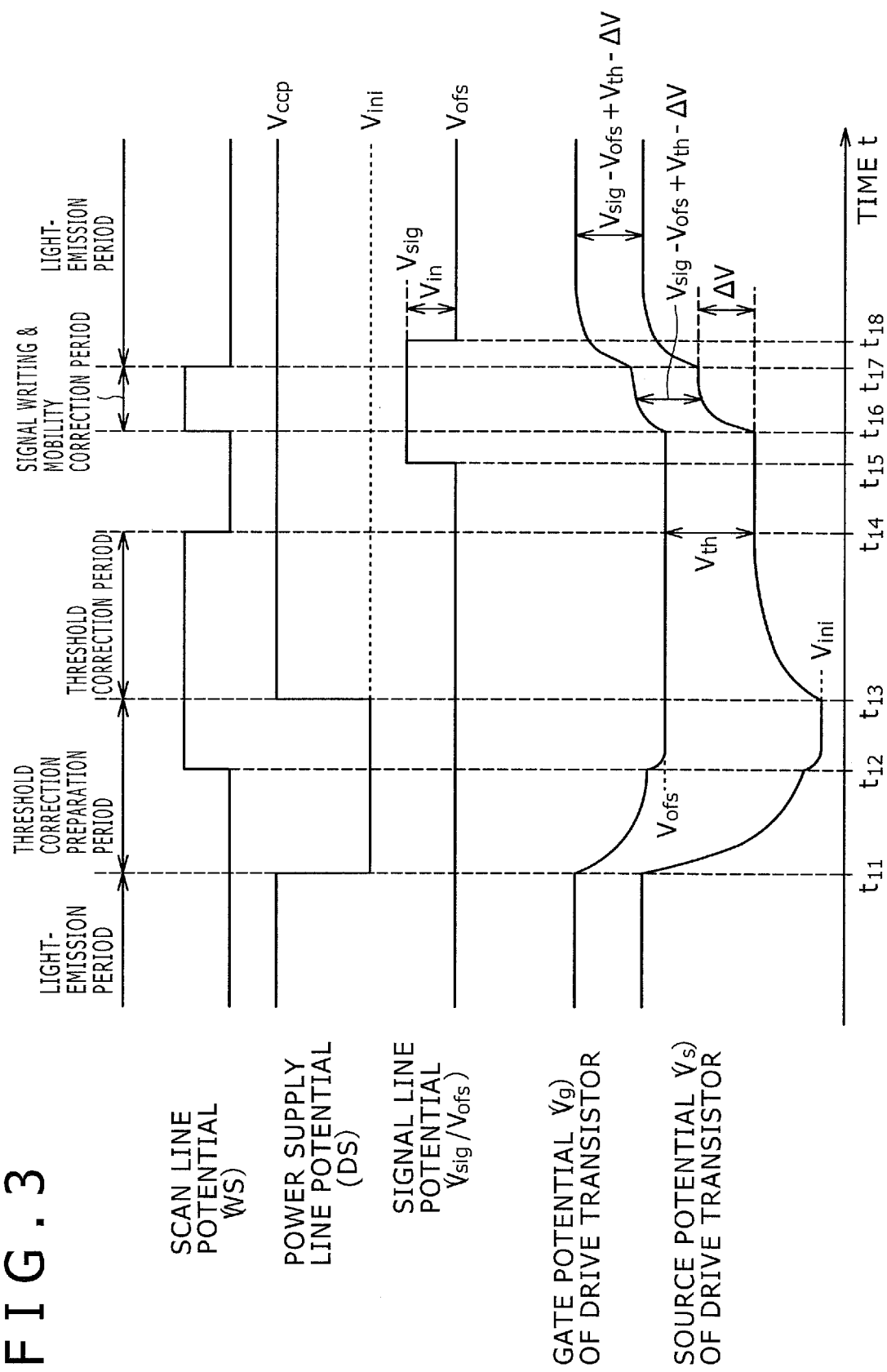
FIG. 3 is a timing waveform diagram for explaining the basic circuit operation of the organic EL display device to which one embodiment of the present disclosure is applied.

The timing waveform diagram of FIG. 3 shows change in each of the potential (write scan signal) WS of the scan line 31, the potential (supply potential) DS of the power supply line 32, the potential ($V_{sig}/V_{ofs}$) of the signal line 33, and the gate potential $V_g$ and the source potential $V_s$ of the drive transistor 22.

(Light-Emission Period of Previous Display Frame)

In the timing waveform diagram of FIG. 3, the period before a time $t_{11}$ is the light-emission period of the organic EL element 21 in the previous display frame. In this light-emission period of the previous display frame, the potential DS of the power supply line 32 is the first supply potential (hereinafter, referred to as "higher potential") $V_{ccp}$ and the write transistor 23 is in the non-conductive state.

Figure 4A:
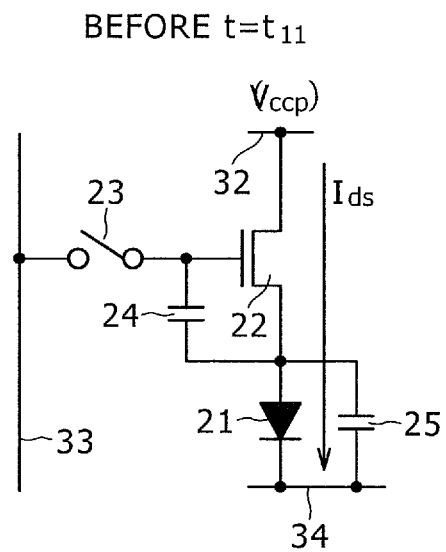
FIGS. 4A to 4D are operation explanatory diagrams (first diagrams) of the basic circuit operation of the organic EL display device to which one embodiment of the present disclosure is applied.

The drive transistor 22 is so designed as to operate in the saturation region at this time. Thus, as shown in FIG. 4A, the drive current (drain-source current) $I_{ds}$ depending on the gate-source voltage $V_{gs}$ of the drive transistor 22 is supplied from the power supply line 32 to the organic EL element 21 via the drive transistor 22. Therefore, the organic EL element 21 emits light with the luminance depending on the current value of the drive current $I_{ds}$.

(Threshold Correction Preparation Period)

Figure 4B:
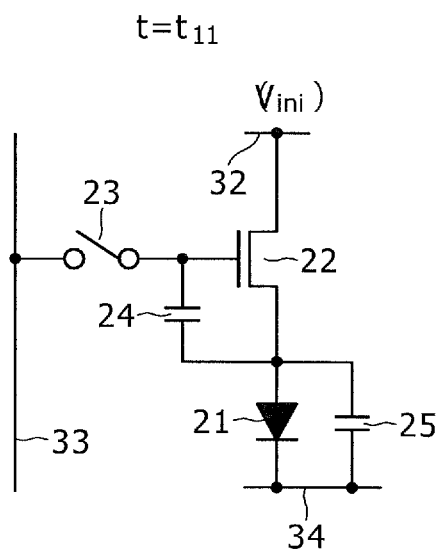

At the time $t_{11}$, a new display frame (present display frame) of the line-sequential scanning starts. At this time, as shown in FIG. 4B, the potential DS of the power supply line 32 is switched from the higher potential $V_{ccp}$ to the second supply potential (hereinafter, referred to as "lower potential") $V_{ini}$ sufficiently lower than $V_{ofs}-V_{th}$ with respect to the reference voltage $V_{ofs}$ of the signal line 33.

Here, the threshold voltage of the organic EL element 21 is defined as $V_{thel}$ and the potential of the common power supply line 34 (cathode potential) is defined as $V_{cath}$. If the lower potential $V_{ini}$ is so set as to satisfy a relationship of $V_{ini}<V_{thel}+V_{cath}$, the organic EL element 21 becomes the reverse-biased state and stops its light emission because the source potential $V_s$ of the drive transistor 22 becomes almost equal to the lower potential $V_{ini}$.

Figure 4C:
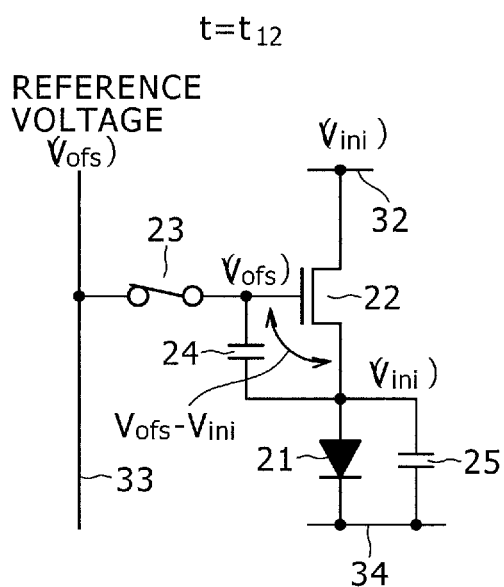

Next, the potential WS of the scan line 31 is shifted from the lower-potential side to the higher-potential side at a time $t_{12}$. Thereby, the write transistor 23 becomes the conductive state as shown in FIG. 4C. At this time, the reference voltage $V_{ofs}$ is supplied from the signal output circuit 60 to the signal line 33 and therefore the gate potential $V_g$ of the drive transistor 22 becomes the reference voltage $V_{ofs}$. The source potential $V_s$ of the drive transistor 22 is a potential sufficiently lower than the reference voltage $V_{ofs}$, i.e. the lower potential $V_{ini}$.

At this time, the gate-source voltage $V_{gs}$ of the drive transistor 22 is $V_{ofs}-V_{ini}$. Unless $V_{ofs}-V_{ini}$ is higher than the threshold voltage $V_{th}$ of the drive transistor 22, the threshold correction processing to be described later cannot be executed. Therefore, a potential relationship of $V_{ofs}-V_{ini}>V_{th}$ should be set.

This processing of initializing the potentials by fixing the gate potential $V_g$ of the drive transistor 22 to the reference voltage $V_{ofs}$ and fixing (settling) the source potential $V_s$ to the lower potential $V_{ini}$ in this manner is preparation (threshold correction preparation) processing preceding the threshold correction processing (threshold correction operation) to be described later. Therefore, the reference voltage $V_{ofs}$ and the lower potential $V_{ini}$ serve as the initialization potential for the gate potential $V_g$ and the source potential $V_s$, respectively, of the drive transistor 22.

(Threshold Correction Period)

Figure 4D:
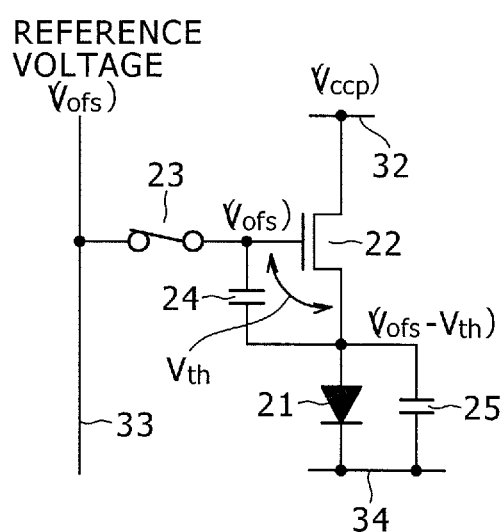

Next, at a time $t_{13}$, the potential DS of the power supply line 32 is switched from the lower potential $V_{ini}$ to the higher potential $V_{ccp}$ as shown in FIG. 4D. Thereupon, the threshold correction processing is started, with the gate potential $V_g$ of the drive transistor 22 kept at the reference voltage $V_{ofs}$. Specifically, the source potential $V_s$ of the drive transistor 22 starts to rise toward the potential obtained by subtracting the threshold voltage $V_{th}$ of the drive transistor 22 from the gate potential $V_g$.

Here, for convenience, the processing in which the initialization potential $V_{ofs}$ for the gate potential $V_g$ of the drive transistor 22 is used as the basis and the source potential $V_s$ is changed toward the potential obtained by subtracting the threshold voltage $V_{th}$ of the drive transistor 22 from this initialization potential $V_{ofs}$ is called the threshold correction processing. Along with the progression of this threshold correction processing, the gate-source voltage $V_{gs}$ of the drive transistor 22 converges on the threshold voltage $V_{th}$ of the drive transistor 22 in due course. The voltage equivalent to this threshold voltage $V_{th}$ is held in the hold capacitance 24.

In order that the current may flow exclusively to the hold capacitance 24 and be prevented from flowing to the organic EL element 21 in the period of the threshold correction processing (threshold correction period), the potential $V_{cath}$ of the common power supply line 34 is so set that the organic EL element 21 is kept at the cut-off state in this period.

Figure 5A:
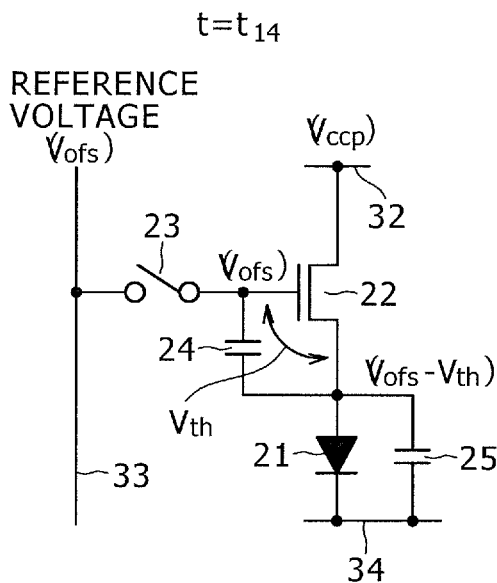
FIGS. 5A to 5D are operation explanatory diagrams (second diagrams) of the basic circuit operation of the organic EL display device to which one embodiment of the present disclosure is applied.

Next, the potential WS of the scan line 31 is shifted to the lower-potential side at a time $t_{14}$. Thereby, the write transistor 23 becomes the non-conductive state as shown in FIG. 5A. At this time, the gate electrode of the drive transistor 22 is electrically isolated from the signal line 33 to thereby become the floating state. However, because the gate-source voltage $V_{gs}$ is equal to the threshold voltage $V_{th}$ of the drive transistor 22, the drive transistor 22 is in the cut-off state. Therefore, the drain-source current $I_{ds}$ does not flow through the drive transistor 22.

(Signal Writing and Mobility Correction Period)

Figure 5B:
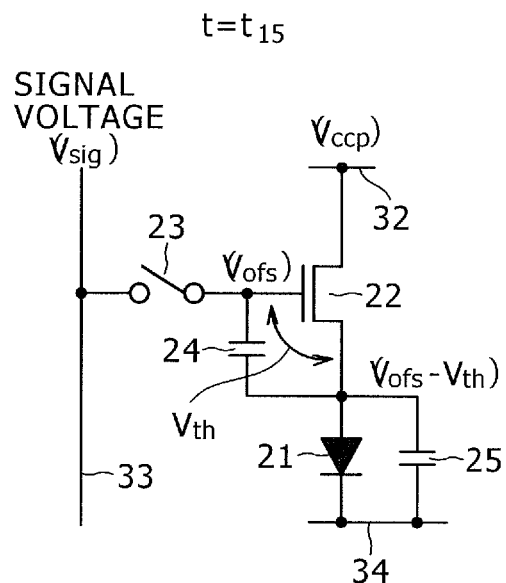
Figure 5C:
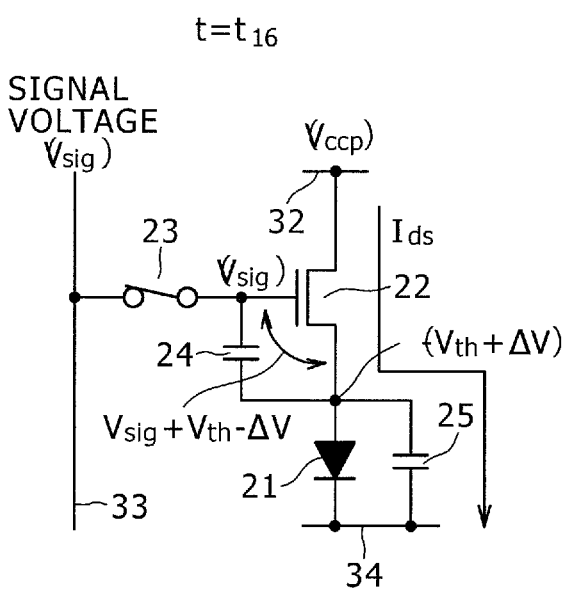

Next, at a time $t_{15}$, the potential of the signal line 33 is switched from the reference voltage $V_{ofs}$ to the signal voltage $V_{sig}$ of the video signal as shown in FIG. 5B. Subsequently, at a time $t_{16}$, the potential WS of the scan line 31 is shifted to the higher-potential side. Thereby, as shown in FIG. 5C, the write transistor 23 becomes the conductive state to perform sampling of the signal voltage $V_{sig}$ of the video signal and write it in the pixel 20.

Due to this writing of the signal voltage $V_{sig}$ by the write transistor 23, the gate potential $V_g$ of the drive transistor 22 becomes the signal voltage $V_{sig}$. In driving of the drive transistor 22 based on the signal voltage $V_{sig}$ of the video signal, the threshold voltage $V_{th}$ of the drive transistor 22 is canceled out by the voltage equivalent to the threshold voltage $V_{th}$ held in the hold capacitance 24. Details of the principle of this threshold cancel will be described later.

At this time, the organic EL element 21 is in the cut-off state (high-impedance state). Therefore, the current (drain-source current $I_{ds}$) flowing from the power supply line 32 to the drive transistor 22 depending on the signal voltage $V_{sig}$ of the video signal flows into the equivalent capacitance of the organic EL element 21 and the auxiliary capacitance 25. Thereby, the charge of the equivalent capacitance of the organic EL element 21 and the auxiliary capacitance 25 is started.

Due to the charge of the equivalent capacitance of the organic EL element 21 and the auxiliary capacitance 25, the source potential $V_s$ of the drive transistor 22 rises over time. At this time, variation in the threshold voltage $V_{th}$ of the drive transistor 22 from pixel to pixel has been already canceled and the drain-source current $I_{ds}$ of the drive transistor 22 depends on the mobility μ of the drive transistor 22. The mobility μ of the drive transistor 22 is the mobility of the semiconductor thin film configuring the channel of the drive transistor 22.

Here, suppose that the ratio of the held voltage $V_{gs}$ of the hold capacitance 24 to the signal voltage $V_{sig}$ of the video signal, i.e. a writing gain G, is one (ideal value). In this case, due to the rise of the source potential $V_s$ of the drive transistor 22 to a potential of $V_{ofs} - V_{th} + \Delta V$, the gate-source voltage $V_{gs}$ of the drive transistor 22 becomes $V_{sig} - V_{ofs} + V_{th} - \Delta V$.

Specifically, the rise component $\Delta V$ of the source potential $V_s$ of the drive transistor 22 acts in such a manner as to be subtracted from the voltage ($V_{sig} - V_{ofs} + V_{th}$) held in the hold capacitance 24, i.e. as to discharge the charge accumulated in the hold capacitance 24. In other words, the rise component $\Delta V$ of the source potential $V_s$ means negative feedback to the hold capacitance 24. Therefore, the rise component $\Delta V$ of the source potential $V_s$ is equivalent to the feedback amount of the negative feedback.

By applying negative feedback to the gate-source voltage $V_{gs}$ with the feedback amount $\Delta V$ depending on the drain-source current $I_{ds}$ flowing through the drive transistor 22 in this manner, the dependence of the drain-source current $I_{ds}$ of the drive transistor 22 on the mobility μ can be canceled. This cancel processing is the mobility correction processing to correct variation in the mobility μ of the drive transistor 22 from pixel to pixel.

Specifically, when the signal amplitude $V_{in}$ (= $V_{sig} - V_{ofs}$) of the video signal written to the gate electrode of the drive transistor 22 is higher, the drain-source current $I_{ds}$ is larger and thus the absolute value of the feedback amount $\Delta V$ of the negative feedback is also larger. Therefore, the mobility correction processing depending on the light emission luminance level is executed.

If the signal amplitude $V_{in}$ of the video signal is set constant, when the mobility μ of the drive transistor 22 is higher, the absolute value of the feedback amount $\Delta V$ of the negative feedback is also larger. Thus, variation in the mobility μ from pixel to pixel can be eliminated. Therefore, the feedback amount $\Delta V$ of the negative feedback can be regarded also as the correction amount of the mobility correction processing. Details of the principle of the mobility correction will be described later.

(Light-Emission Period)

Figure 5D:
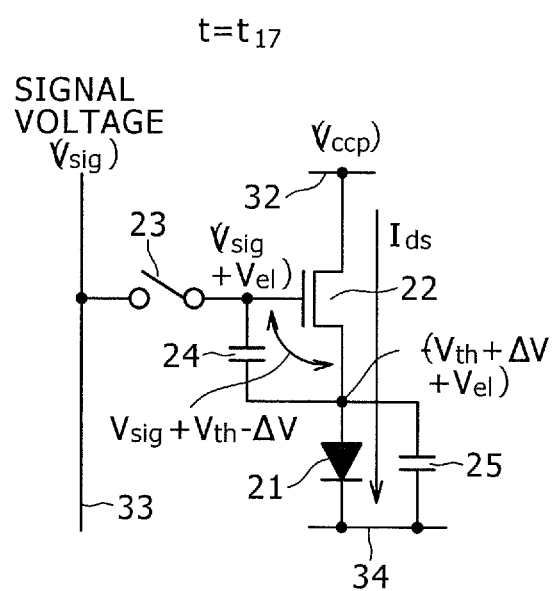

Next, the potential WS of the scan line 31 is shifted to the lower-potential side at a time $t_{17}$. Thereby, the write transistor 23 becomes the non-conductive state as shown in FIG. 5D.

Thus, the gate electrode of the drive transistor 22 is electrically isolated from the signal line 33 and therefore becomes the floating state.

When the gate electrode of the drive transistor 22 is in the floating state, the gate potential $V_g$ also changes in conjunction with change in the source potential $V_s$ of the drive transistor 22 because the hold capacitance 24 is connected between the gate and source of the drive transistor 22. The operation of this change in the gate potential $V_g$ of the drive transistor 22 in conjunction with the change in the source potential $V_s$ is bootstrap operation by the hold capacitance 24.

The gate electrode of the drive transistor 22 becomes the floating state and simultaneously the drain-source current $I_{ds}$ of the drive transistor 22 starts to flow to the organic EL element 21. Thereby, the anode potential of the organic EL element 21 rises depending on this current $I_{ds}$.

When the anode potential of the organic EL element 21 surpasses $V_{thel} + V_{cath}$, the drive current starts to flow to the organic EL element 21 and thus the organic EL element 21 starts light emission. The rise of the anode potential of the organic EL element 21 is nothing more or less than the rise of the source potential $V_s$ of the drive transistor 22. When the source potential $V_s$ of the drive transistor 22 rises, the gate potential $V_g$ of the drive transistor 22 also rises in conjunction with this source potential rise due to the bootstrap operation of the hold capacitance 24.

At this time, the amount of rise of the gate potential $V_g$ is equal to that of rise of the source potential $V_s$ if it is assumed that the bootstrap gain is one (ideal value). Therefore, during the light-emission period, the gate-source voltage $V_{gs}$ of the drive transistor 22 is kept constant at $V_{sig} - V_{ofs} + V_{th} - \Delta V$. At a time $t_{18}$, the potential of the signal line 33 is switched from the signal voltage $V_{sig}$ of the video signal to the reference voltage $V_{ofs}$.

In the above-described series of circuit operation, the respective processing operations of the threshold correction preparation, the threshold correction, the writing of the signal voltage $V_{sig}$ (signal writing), and the mobility correction are carried out in one horizontal scanning period (1H). Furthermore, the respective processing operations of the signal writing and the mobility correction are carried out in parallel in the period from the time $t_{16}$ to the time $t_{17}$.

[Divided Threshold Correction]

The above description is made by taking as an example the case of employing the driving method in which the threshold correction processing is executed only once. However, this driving method is merely one example and the driving method is not limited thereto. For example, it is also possible to employ a driving method in which so-called divided threshold correction is performed, i.e. the threshold correction processing is executed plural times in a divided manner over plural horizontal scanning periods preceding the 1H period in which the threshold correction processing is executed together with the mobility correction and signal writing processing in addition to this 1H period.

If this driving method with the divided threshold correction is employed, a sufficient time can be ensured as the threshold correction period over plural horizontal scanning periods even if the time allocated as one horizontal scanning period becomes short due to increase in the number of pixels in association with enhancement in the definition. Therefore, even if the time allocated as one horizontal scanning period becomes short, the threshold correction processing can be surely executed because a sufficient time can be ensured as the threshold correction period.

[Principle of Threshold Cancel]

The principle of the threshold cancel (i.e. threshold correction) for the drive transistor 22 will be described below. The drive transistor 22 is so designed as to operate in the saturation region and therefore operates as a constant current source. Thus, the constant drain-source current (drive current) $I_{ds}$ given by the following equation (1) is supplied from the drive transistor 22 to the organic EL element 21.

$$I_{ds} = (1/2) \cdot \mu (W/L) C_{ox} (V_{gs} - V_{th})^2 \quad (1)$$

In this equation, W is the channel width of the drive transistor 22. L is the channel length. $C_{ox}$ is the gate capacitance per unit area.

Figure 6A:
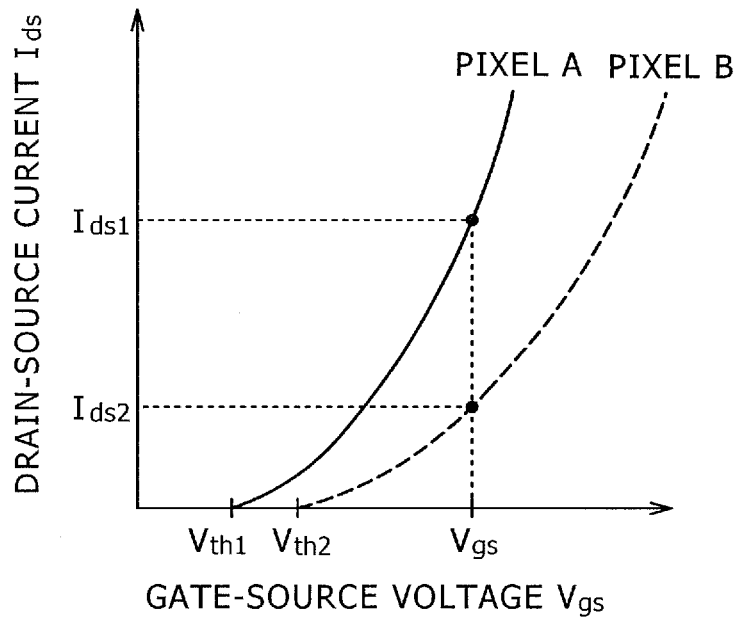
FIGS. 6A and 6B are characteristic diagram FIG. 6A for explaining a problem attributed to variation in the threshold voltage $V_{th}$ of a drive transistor and a characteristic diagram FIG. 6B for explaining a problem attributed to variation in the mobility $\mu$ of the drive transistor.

FIG. 6A shows the characteristic of drain-source current $I_{ds}$ vs. gate-source voltage $V_{gs}$ of the drive transistor 22. As shown in the characteristic diagram of FIG. 6A, unless the cancel processing (correction processing) for variation in the threshold voltage $V_{th}$ of the drive transistor 22 from pixel to pixel is executed, the drain-source current $I_{ds}$ corresponding to the gate-source voltage $V_{gs}$ is $I_{ds1}$ when the threshold voltage $V_{th}$ is $V_{th1}$.

On the other hand, when the threshold voltage $V_{th}$ is $V_{th2}$ ($V_{th2} > V_{th1}$), the drain-source current $I_{ds}$ corresponding to the same gate-source voltage $V_{gs}$ is $I_{ds2}$ ($I_{ds2} < I_{ds1}$). That is, if the threshold voltage $V_{th}$ of the drive transistor 22 varies, the drain-source current $I_{ds}$ varies even when the gate-source voltage $V_{gs}$ is constant.

In the pixel (pixel circuit) 20 having the above-described configuration, the gate-source voltage $V_{gs}$ of the drive transistor 22 in light emission is $V_{sig} - V_{ofs} + V_{th} - \Delta V$ as described above. Therefore, if this voltage $V_{gs}$ is substituted in equation (1), the drain-source current $I_{ds}$ is represented by the following equation (2).

$$I_{ds} = (1/2) \cdot \mu (W/L) C_{ox} (V_{sig} - V_{ofs} - \Delta V)^2 \quad (2)$$

That is, the term of the threshold voltage $V_{th}$ of the drive transistor 22 is canceled, so that the drain-source current $I_{ds}$ supplied from the drive transistor 22 to the organic EL element 21 does not depend on the threshold voltage $V_{th}$ of the drive transistor 22. As a result, even when the threshold voltage $V_{th}$ of the drive transistor 22 varies from pixel to pixel due to variation in the manufacturing process of the drive transistor 22, change over time, and so forth, the drain-source current $I_{ds}$ does not vary and thus the light emission luminance of the organic EL element 21 can be kept constant.

[Principle of Mobility Correction]

Figure 6B:
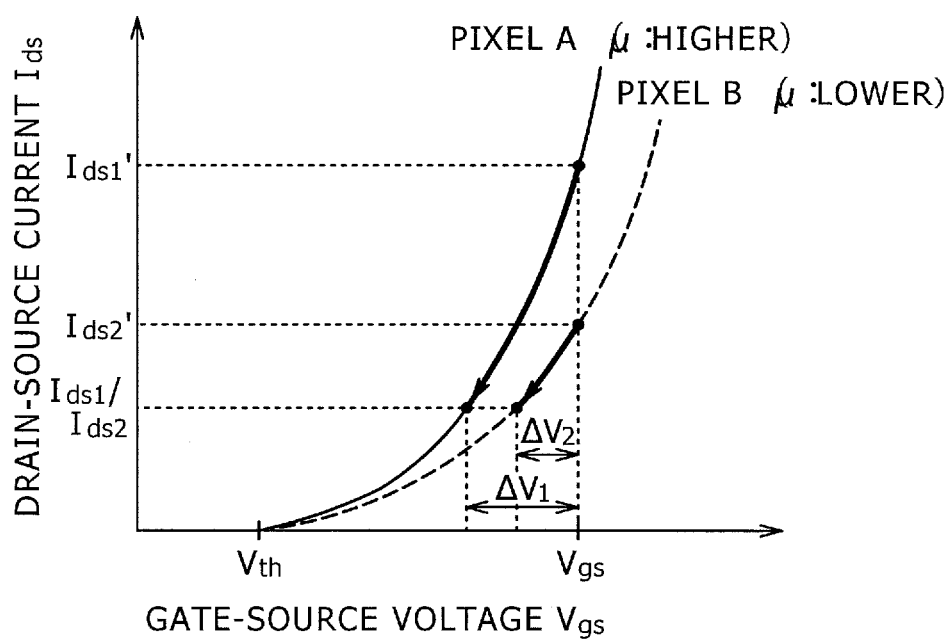

The principle of the mobility correction for the drive transistor 22 will be described below. FIG. 6B shows characteristic curves with comparison between pixel A in which the mobility μ of the drive transistor 22 is relatively higher and pixel B in which the mobility μ of the drive transistor 22 is relatively lower. If the drive transistor 22 is configured by a poly-silicon thin film transistor or the like, inevitably the mobility μ varies among the pixels like pixel A and pixel B.

A consideration will be made below about the case in which the mobility μ varies between pixels A and B and e.g. the signal amplitude $V_{in}$ ($=V_{sig} - V_{ofs}$) at the same level is written to the gate electrode of the drive transistor 22 of both pixels A and B. In this case, if correction of the mobility μ is not performed at all, large difference arises between a drain-source current $I_{ds1}'$ flowing in pixel A having the higher mobility μ and a drain-source current $I_{ds2}'$ flowing in pixel B having the lower mobility μ. If large difference in the drain-source current $I_{ds}$ arises among the pixels attributed to variation in the mobility μ among the pixels in this manner, the uniformity (evenness) of the screen is spoiled.

As is apparent from the transistor characteristic expression of the above-described equation (1), the higher mobility μ yields the larger drain-source current $I_{ds}$. Therefore, the higher the mobility μ is, the larger the feedback amount $\Delta V$ of negative feedback is. As shown in FIG. 6B, a feedback amount $\Delta V_1$ in pixel A having the higher mobility μ is larger than a feedback amount $\Delta V_2$ in pixel B having the lower mobility μ.

So, if negative feedback is applied to the gate-source voltage $V_{gs}$ with the feedback amount $\Delta V$ depending on the drain-source current $I_{ds}$ of the drive transistor 22 by the mobility correction processing, the extent of this negative feedback is larger when the mobility μ is higher. As a result, the variation in the mobility μ from pixel to pixel can be suppressed.

Specifically, when correction with the feedback amount $\Delta V_1$ is performed in pixel A having the higher mobility μ, the drain-source current $I_{ds}$ greatly drops from $I_{ds1}'$ to $I_{ds1}$. In contrast, the feedback amount $\Delta V_2$ in pixel B having the lower mobility μ is small. Therefore, the drain-source current $I_{ds}$ does not drop so greatly, i.e. the drop is from $I_{ds2}'$ to $I_{ds2}$. As a result, the drain-source current $I_{ds1}'$ of pixel A is almost equal to the drain-source current $I_{ds2}$ of pixel B, so that the variation in the mobility μ from pixel to pixel is corrected.

In conclusion, when there are pixel A and pixel B having the different mobility p, the feedback amount $\Delta V_1$ in pixel A having the higher mobility μ is larger than the feedback amount $\Delta V_2$ in pixel B having the lower mobility μ. That is, the feedback amount $\Delta V$ is larger and the amount of decrease in the drain-source current $I_{ds}$ is larger in the pixel having the higher mobility μ.

Therefore, by applying negative feedback to the gate-source voltage $V_{gs}$ with the feedback amount $\Delta V$ depending on the drain-source current $I_{ds}$ of the drive transistor 22, the current value of the drain-source current $I_{ds}$ of the pixels having the different mobility is made uniform. As a result, variation in the mobility μ from pixel to pixel can be corrected. That is, the mobility correction processing is the processing of applying negative feedback to the gate-source voltage $V_{gs}$ of the drive transistor 22, i.e. the hold capacitance 24, with the feedback amount (correction amount) $\Delta V$ depending on the current (drain-source current $I_{ds}$) flowing through the drive transistor 22.

[1-3. System of Combination of White Organic EL Element and Color Filter]

Figure 7:
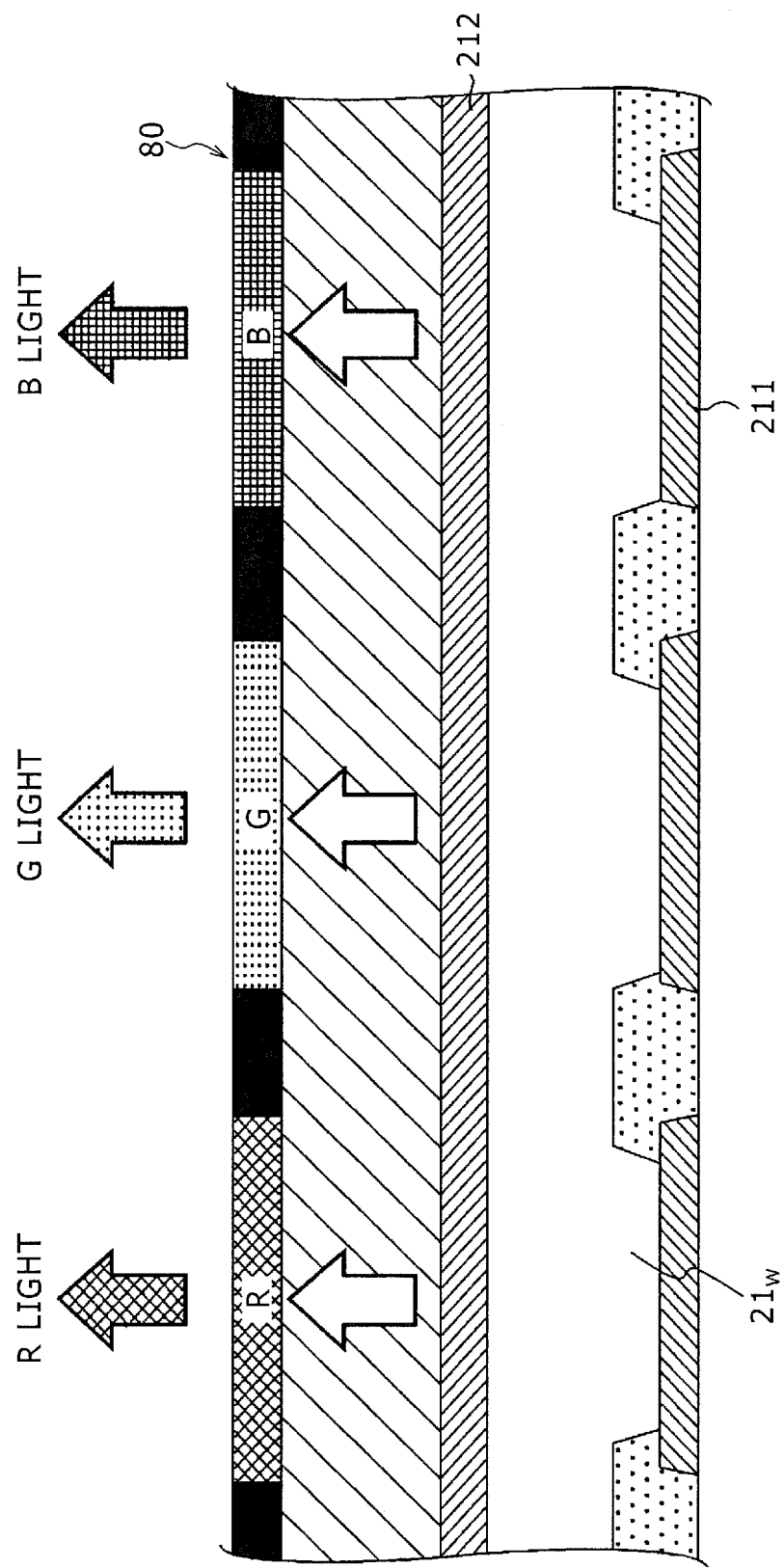
FIG. 7 is a sectional view showing one example of a pixel structure of a system of the combination of a white organic EL element and a color filter.

In the organic EL display device 10 according to the above-described present application example, the RGB mask separate-application system is not employed and a system in which the respective color light beams of RGB are obtained by the combination of a white organic EL element $21_W$ and a color filter 80 as shown in FIG. 7 is employed. The RGB mask separate-application system is a system in which organic EL materials of RGB are separately applied by evaporation with use of a mask. The system of the combination of the white organic EL element $21_W$ and the color filter 80 is suitable for increase in the size and definition of the display panel 70.

(White Organic EL Element Having Tandem Structure)

As the white organic EL element $21_W$, an organic EL element having a tandem structure is widely known. For example, the tandem structure is formed by coupling (stacking) plural units (light emitting units) of an organic layer including the respective light emitting layers of RGB in a series (tandem) manner with the intermediary of connecting layers. From the white organic EL element having this tandem structure, white light is obtained through superposition of the light emission of the respective light emitting units of RGB.

Figure 8:
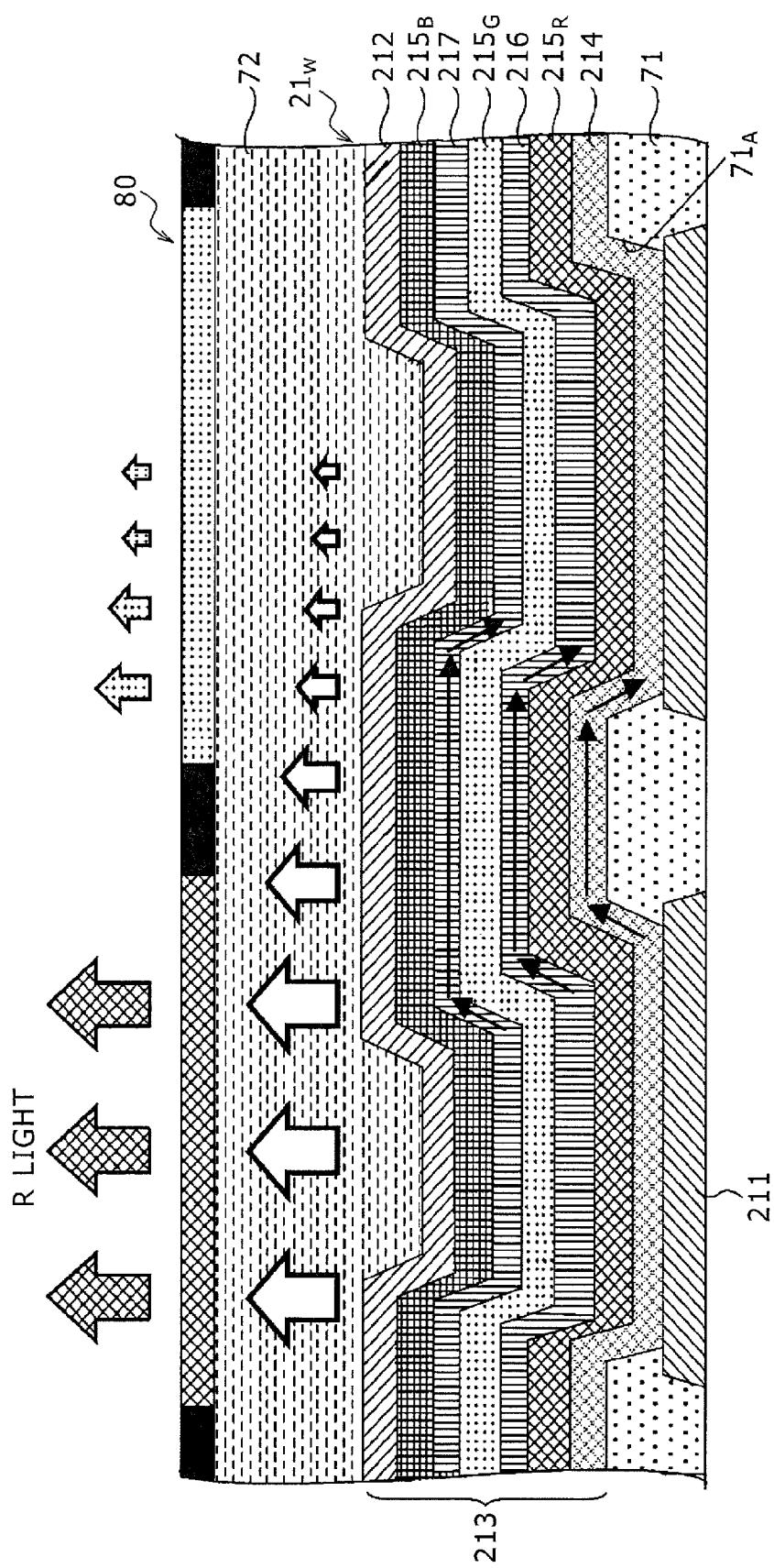
FIG. 8 is a sectional view of the major part showing one example of the structure of a white organic EL element having a typical tandem structure.

FIG. 8 is a sectional view of the major part showing one example of the structure of the white organic EL element having a typical tandem structure. Here, a three-stage tandem structure is taken as one example and a basic structure is shown in a simplified manner for simplification of the diagram. Furthermore, FIG. 8 shows the pixel structure of two sub-pixels of RG among three sub-pixels of RGB.

Referring to FIG. 8, anode electrodes 211 ($211_R$, $211_G$, $211_B$) are provided on a pixel-by-pixel basis at the bottom of a recess $71_A$ of a window insulating film 71. An organic layer 213 is provided in common to all pixels between the anode electrodes 211 and a cathode electrode 212 provided in common to all pixels, so that the white organic EL element $21_W$ is configured. An interlayer insulating film 72 is stacked on the cathode electrode 212 and the color filter 80 is formed on this interlayer insulating film 72 in an on-chip form (on-chip color filter).

In the white organic EL element $21_W$, the organic layer 213 is formed by sequentially depositing a charge injection layer 214, a light emitting layer $215_R$ of R, a connecting layer 216, a light emitting layer $215_G$ of G, a connecting layer 217, and a light emitting layer $215_B$ of B over the anode electrodes 211 in common to all pixels, as one example. Under current driving by the drive transistor 22 in FIG. 2, a current flows from the drive transistor 22 to the organic layer 213 via the anode electrode 211. Thereby, recombination of electrons and holes occurs in the respective light emitting layers $215_R$, $215_G$, and $215_B$ in the organic layer 213. In this recombination, light emission occurs.

At this time, the light emission colors of the respective light emitting layers $215_R$, $215_G$, and $215_B$ of R, G, and B are superimposed on (combined with) each other to become white light. The white light emitted from the white organic EL element $21_W$ on a pixel-by-pixel basis is transmitted through the color filter 80. By combining the white organic EL element $21_W$ with the color filter 80 in this manner, the respective color light beams of R, G, and B can be obtained from the white light.

[1-4. Problem of Leakage Current Due to Existence of Common Layer]

In the organic EL display device 10 formed by disposing the pixels (sub-pixels) including the white organic EL element $21_W$ having the above-described tandem structure, a common layer formed in common to the respective pixels exists. Specifically, as is apparent from FIG. 8 particularly, the charge injection layer 214, the connecting layer 216, and the connecting layer 217 are the common layers formed in common to the respective pixels.

Figure 9:
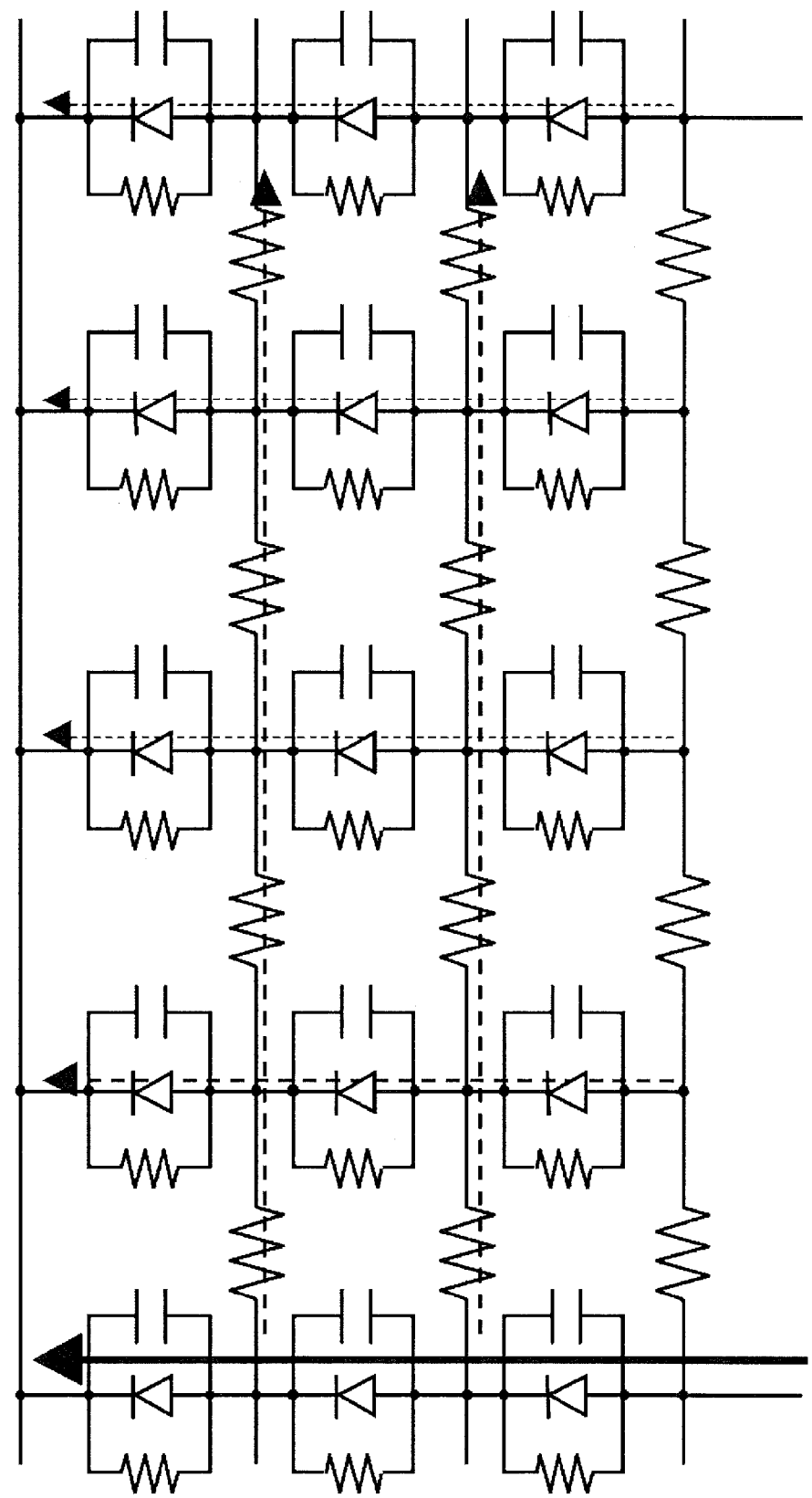
FIG. 9 is a circuit diagram showing the equivalent circuit of a display panel employing the system of the combination of the white organic EL element and the color filter.

A consideration will be made about a problem of leakage current due to the existence of the common layer (leakage current flowing through the common layer) by taking as an example the case in which only the pixel (sub-pixel) of R emits light in FIG. 8. FIG. 9 shows the equivalent circuit of the display panel 70 in the case of employing the system of the combination of the white organic EL element $21_W$ and the color filter 80.

In the display panel 70 employing the system of the combination of the white organic EL element $21_W$ and the color filter 80, leakage in the lateral direction occurs in layers (common layers) having comparatively-low impedance, such as the charge injection layer 214 and the connecting layers 216 and 217. The lateral direction refers to the flow direction of the leakage current when the flow direction of the current flowing in the white organic EL element $21_W$ is defined as the vertical direction. Due to this leakage current, an area outside the anode electrode 211 also emits light.

No problem is caused if the distance between adjacent pixels is sufficiently long (separate). However, if the distance between adjacent pixels is short and the leakage current flows into the adjacent pixel, the area of light emission accompanying the leakage current ranges to the adjacent pixel. As a result, the adjacent pixel also emits light. In FIG. 8, the size of the arrow representing the light emission color conceptually indicates the intensity of this light. In the case of the present example, the pixel of G adjacent to the pixel of R that should emit light originally also emits light. This deteriorates the color reproducibility (color purity). Although the light emitting layers $215_R$, $215_G$, and $215_B$ are also common layers, generally they are free from the problem of the leakage because the impedance thereof is high compared with the charge injection layer 214, the connecting layers 216 and 217, and so forth.

2. Description of Embodiment

In the present embodiment, in order to solve the problem of the leakage current due to the existence of the common layer in an organic EL display device including at least one common layer formed in an organic layer in common to the pixels, a metal interconnect electrically connected to the organic layer is so formed as to surround the periphery of the anode electrode. Furthermore, the present embodiment employs a configuration in which the potential of this metal interconnect is set to a potential lower than the potential of the anode electrode in the non-light-emission state of the organic EL element.

Due to the characteristic that the metal interconnect electrically connected to the organic layer is formed around the anode electrode, even when a leakage current flows in the lateral direction through the common layer in the organic layer, this leakage current flows to the metal interconnect side. This can reduce the leakage current flowing into the adjacent pixel and thus can suppress light emission in the adjacent pixel. As a result, favorable color reproducibility (color purity) can be achieved.

[2-1. Pixel Structure to Reduce Leakage Current]

A pixel structure to reduce the leakage current flowing through the common layer in the organic layer will be specifically described below.

Figure 10:
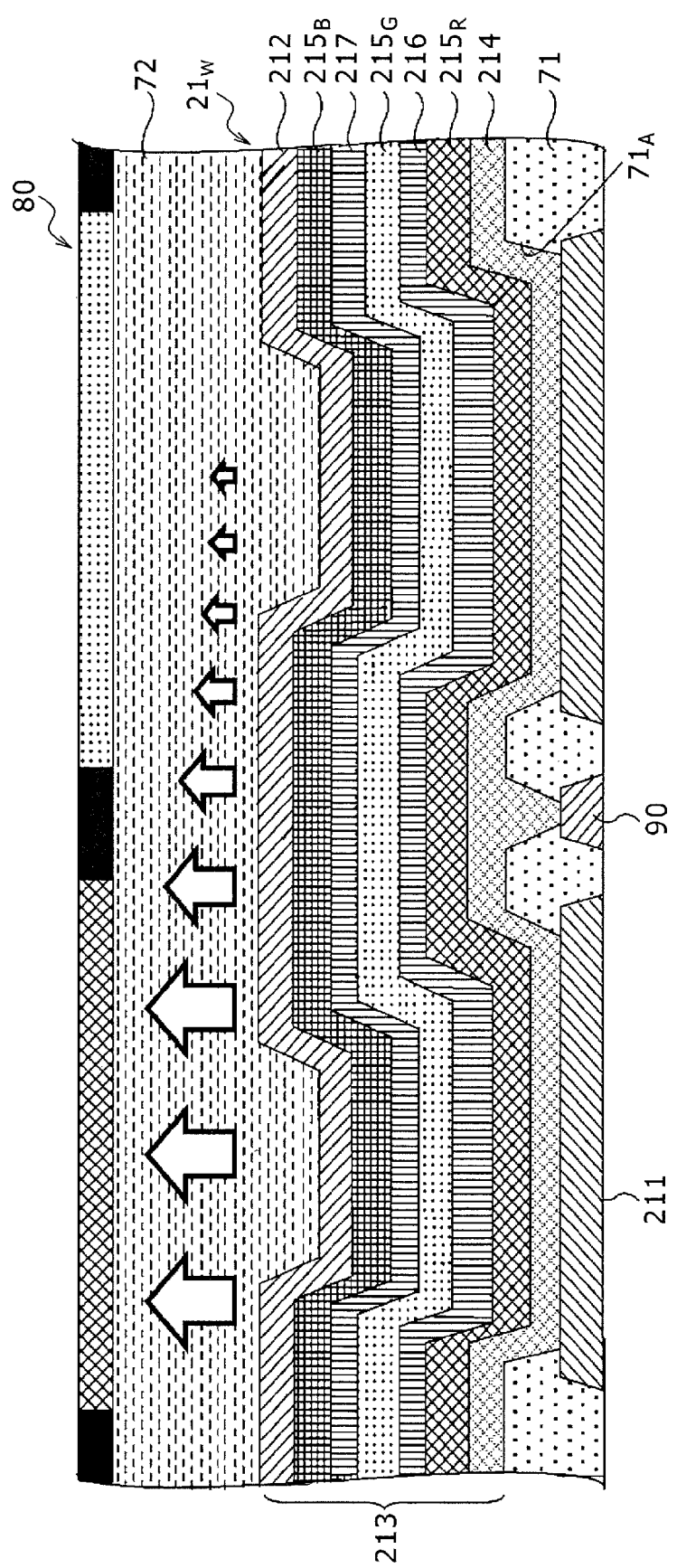
FIG. 10 is a sectional view of the major part showing one example of a pixel structure including a white organic EL element having a tandem structure according to an embodiment of the present disclosure.
Figure 11:
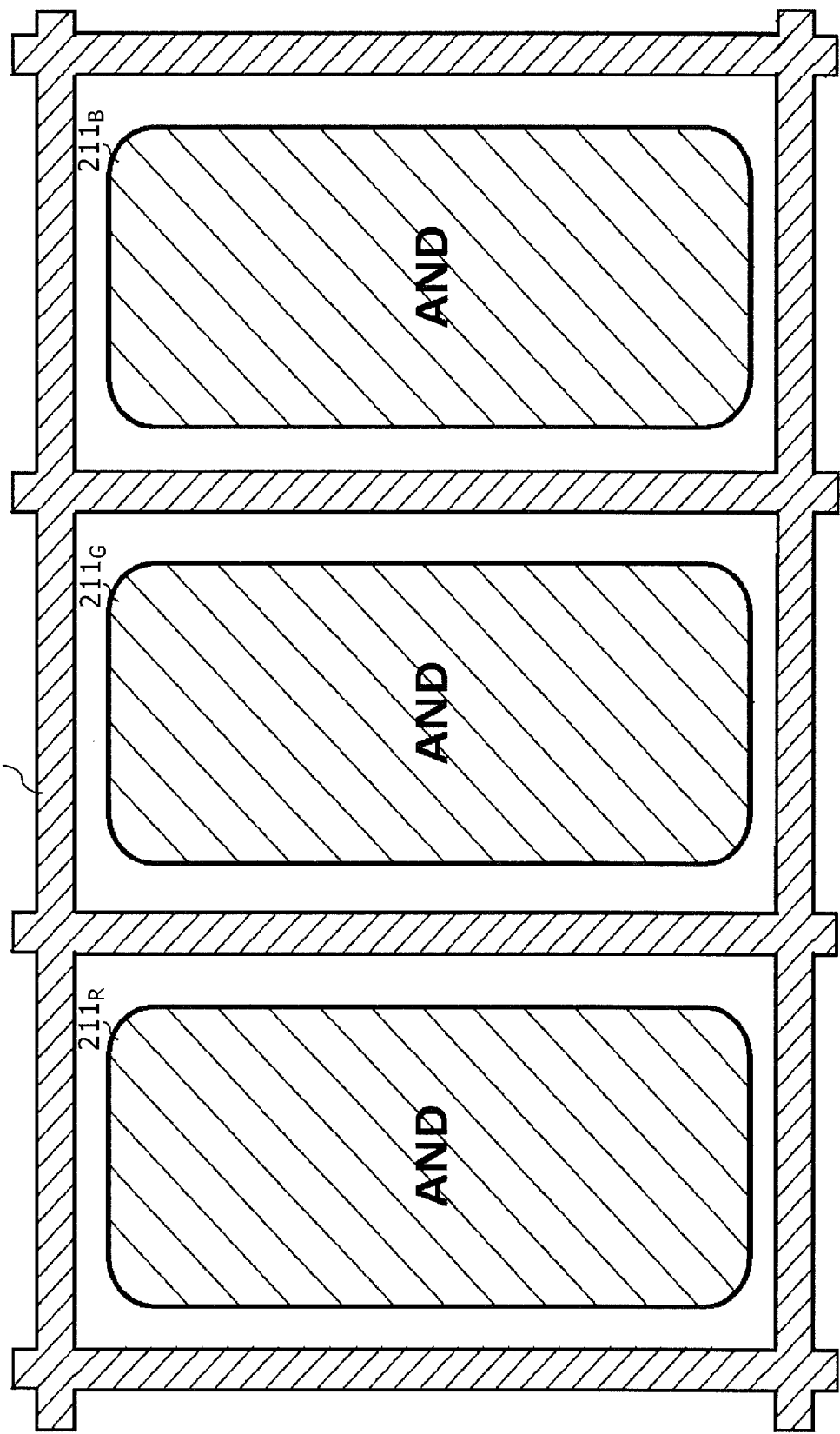
FIG. 11 is a planar pattern diagram showing anode electrodes and the periphery thereof.

FIG. 10 is a sectional view of the major part showing one example of the pixel structure including a white organic EL element having a tandem structure according to the embodiment. In FIG. 10, the part equivalent to that in FIG. 8 is given the same numeral. FIG. 11 shows a planar pattern diagram of the anode electrodes and the periphery thereof. Here, a three-stage tandem structure is taken as one example and a basic structure is shown in a simplified manner for simplification of the diagram. Furthermore, FIG. 10 shows the pixel structure of two sub-pixels of RG among three sub-pixels of RGB.

Regarding the basic structure, the white organic EL element having the tandem structure according to the present embodiment is the same as the above-described white organic EL element having the typical tandem structure. Specifically, as shown in FIG. 10, the anode electrodes 211 ($211_R$, $211_G$, $211_B$) are provided on a pixel-by-pixel basis at the bottom of the recess $71_A$ of the window insulating film 71. The organic layer 213 is provided in common to all pixels between the anode electrodes 211 and the cathode electrode 212 provided in common to all pixels, so that the white organic EL element $21_W$ is configured.

In the white organic EL element $21_W$, the organic layer 213 is formed by sequentially depositing the charge injection layer 214, the light emitting layer $215_R$ of R, the connecting layer 216, the light emitting layer 215$_G$ of G, the connecting layer 217, and the light emitting layer 215$_B$ of B over the anode electrodes 211 in common to all pixels, as one example. The interlayer insulating film 72 is stacked on the cathode electrode 212 and the color filter 80 is formed on this interlayer insulating film 72 in an on-chip form.

In the pixel structure including the white organic EL element 21$_W$ having the tandem structure with the above-described configuration, the present embodiment has the following features. First, a metal interconnect 90 is so formed as to surround the periphery of the anode electrodes 211 (211$_R$, 211$_G$, 211$_B$) formed on a pixel-by-pixel basis, specifically at the same layer as that of the anode electrodes 211.

Furthermore, to this metal interconnect 90, a potential lower than the potential of the anode electrode 211 in the non-light-emission state of the white organic EL element 21$_W$, e.g. the potential of the cathode electrode 212 (cathode potential V$_{cath}$), is given. Using the cathode potential V$_{cath}$ as the potential of the metal interconnect 90 provides an advantage that the potential used exclusively for the metal interconnect 90 does not need to be prepared.

It is preferable to use, as the material of the metal interconnect 90, the same material as that of the anode electrode 211, e.g. an interconnect material such as aluminum (Al) or silver (Ag). This is because using the same material as that of the anode electrode 211 as the material of the metal interconnect 90 provides an advantage that the metal interconnect 90 can be formed in the same step as that of the anode electrode 211 and thus the number of steps does not need to be increased. Forming the metal interconnect 90 at the same layer as that of the anode electrode 211 is also because of the same reason.

A contact hole 71$_B$ is formed at the site between the pixels in the window insulating film 71, i.e. the site at which the metal interconnect 90 is formed. Via this contact hole 71$_B$, the metal interconnect 90 is electrically connected to the organic layer 213, specifically the charge injection layer 214 as the lowermost layer of the organic layer 213 in the present example.

[2-2. Operation and Effect of Embodiment]

Figure 12:
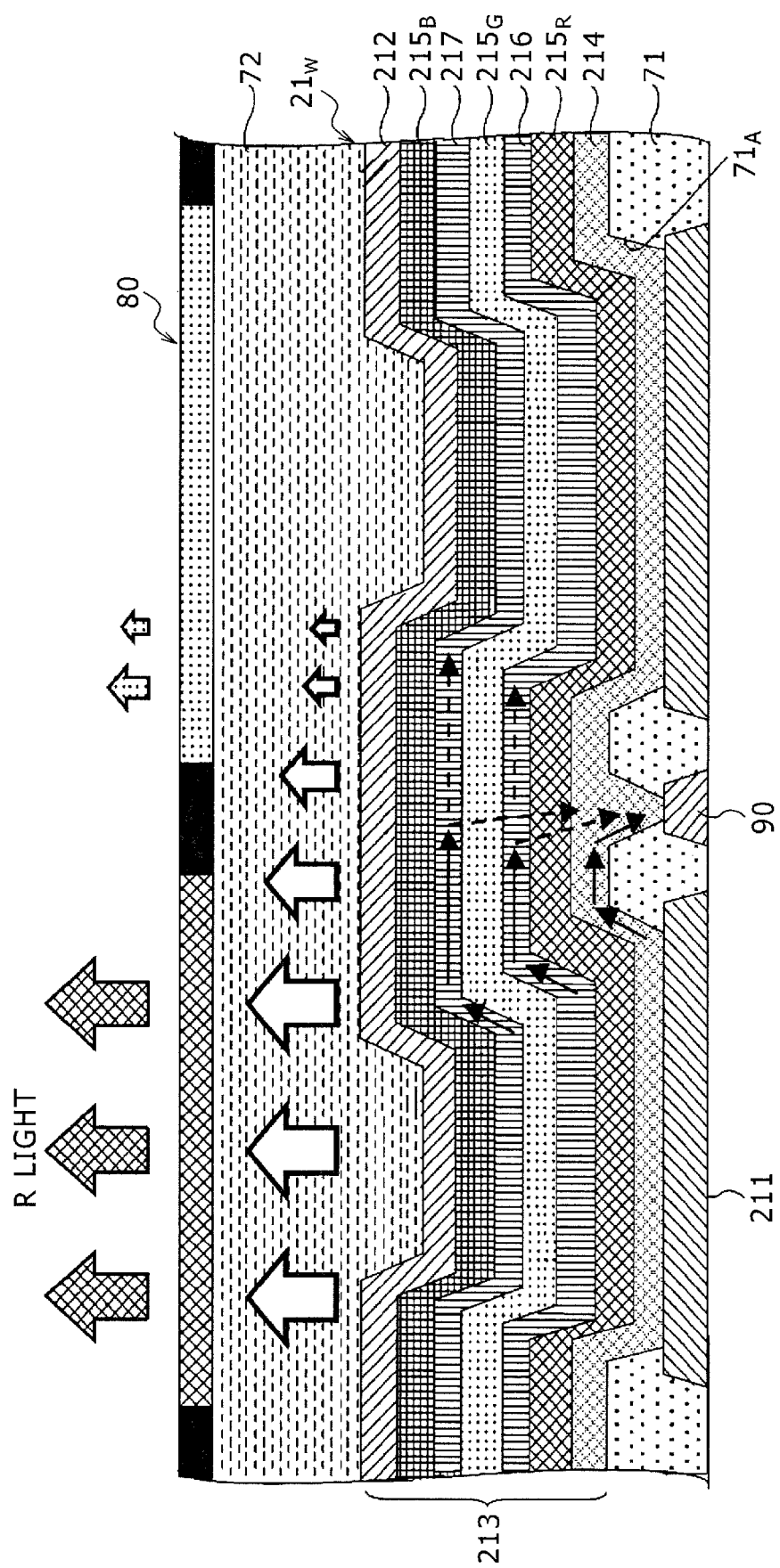
FIG. 12 is an explanatory diagram about the operation and effect of the embodiment.

The following operation and effect can be achieved by forming the metal interconnect 90 electrically connected to the organic layer 213 in such a manner that the metal interconnect 90 surrounds the periphery of the anode electrode 211 and setting the potential of the metal interconnect 90 to the cathode potential V$_{cath}$ as described above. Specifically, when a leakage current flows in the lateral direction through the common layer in the organic layer 213, specifically through the charge injection layer 214 and the connecting layers 216 and 217 in the present example, the leakage current flows into the metal interconnect 90 through the site of the contact hole 71$_B$ (hereinafter, referred to as "contact part 71$_B$") as shown in FIG. 12.

Thus, the leakage current flowing through the charge injection layer 214 completely flows into the metal interconnect 90 because this charge injection layer 214 is electrically connected to the metal interconnect 90. That is, the leakage current flowing in the lateral direction through the charge injection layer 214 is completely blocked from flowing to the adjacent pixel side by the contact part 71$_B$.

Figure 13:
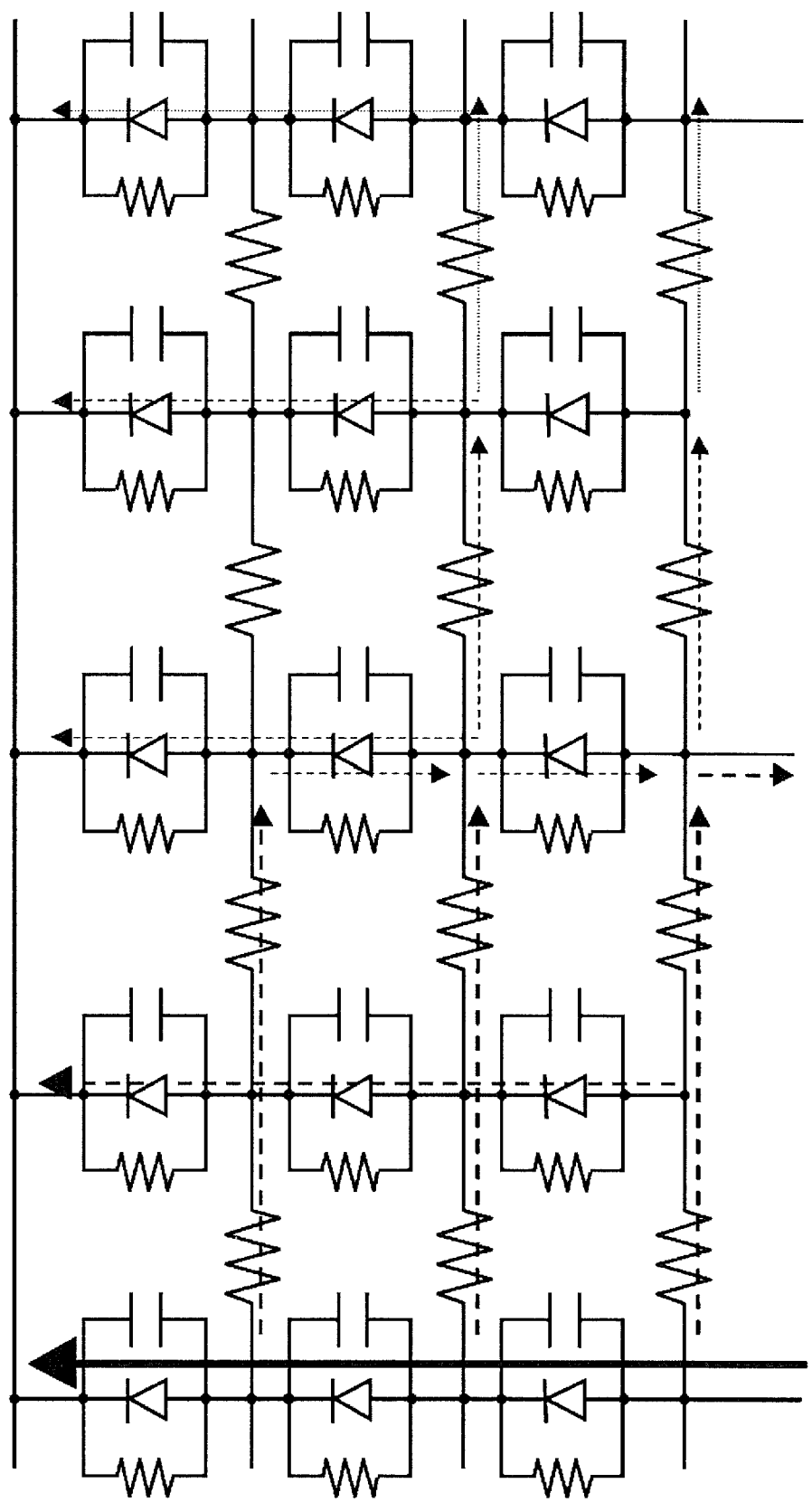
FIG. 13 is a circuit diagram showing the equivalent circuit of the display panel having the pixel structure according to the embodiment.

The leakage current flowing in the lateral direction through the connecting layers 216 and 217 is divided into a component flowing into the contact part 71$_B$, a component flowing into the adjacent pixel side, and a component contributing to light emission. Therefore, the leakage current flowing through the connecting layers 216 and 217 can also be reduced compared with the case in which the metal interconnect 90 is not provided. In FIG. 12, the size of the arrow representing the light emission color conceptually indicates the intensity of this light. FIG. 13 shows the equivalent circuit of the display panel having the pixel structure according to the embodiment.

In this manner, the leakage current flowing into the adjacent pixel side can be reduced even when the leakage current flows in the lateral direction through the charge injection layer 214 and the connecting layers 216 and 217. This can suppress light emission in the adjacent pixel attributed to the leakage current and thus can achieve favorable color reproducibility (color purity).

In the present embodiment, the metal interconnect 90 surrounding the periphery of the anode electrode 211 is formed at the common layer with the anode electrode 211. However, the configuration is not limited thereto. Specifically, the layer at which the metal interconnect 90 is formed may be any layer as long as it is a layer that can be electrically connected to the organic layer 213 of the white organic EL element 21$_W$.

Furthermore, the potential of the metal interconnect 90 surrounding the periphery of the anode electrode 211 is set to the cathode potential V$_{cath}$ in the present embodiment. However, the potential is not limited to the cathode potential V$_{cath}$ but may be any potential as long as it is a potential lower than the potential of the anode electrode 211 in the non-light-emission state of the white organic EL element 21$_W$.

3. Modification Example

The above-described embodiment is explained by taking as an example the case of employing the system in which the respective color light beams of RGB are obtained by the combination of the white organic EL element 21$_W$ and the color filter 80 and applying the system to the pixel structure (display panel) of the tandem structure. However, the present disclosure is not limited to this application example. Specifically, embodiments of the present disclosure can be applied to the overall organic EL display devices that do not employ the configuration of the tandem structure but have a pixel structure including at least one common layer formed in an organic layer in common to the pixels.

However, in the case of the pixel structure of the tandem structure, the connecting layers 216 and 217 to couple the light emitting units including the light emitting elements of the respective color light beams exist and a leakage current flows through these connecting layers 216 and 217. Thus, the problem associated with the leakage current is significant. Therefore, it can be said that the advantageous effects of the technique of the present disclosure are extremely large when an embodiment of the present disclosure is applied to the pixel structure of the tandem structure particularly.

Examples of other pixel structures including at least one common layer in an organic layer include a pixel structure employing the RGB mask separate-application system, in which organic EL materials of RGB are separately applied by evaporation with use of a mask. This pixel structure will be described with use of FIG. 14.

Figure 14:
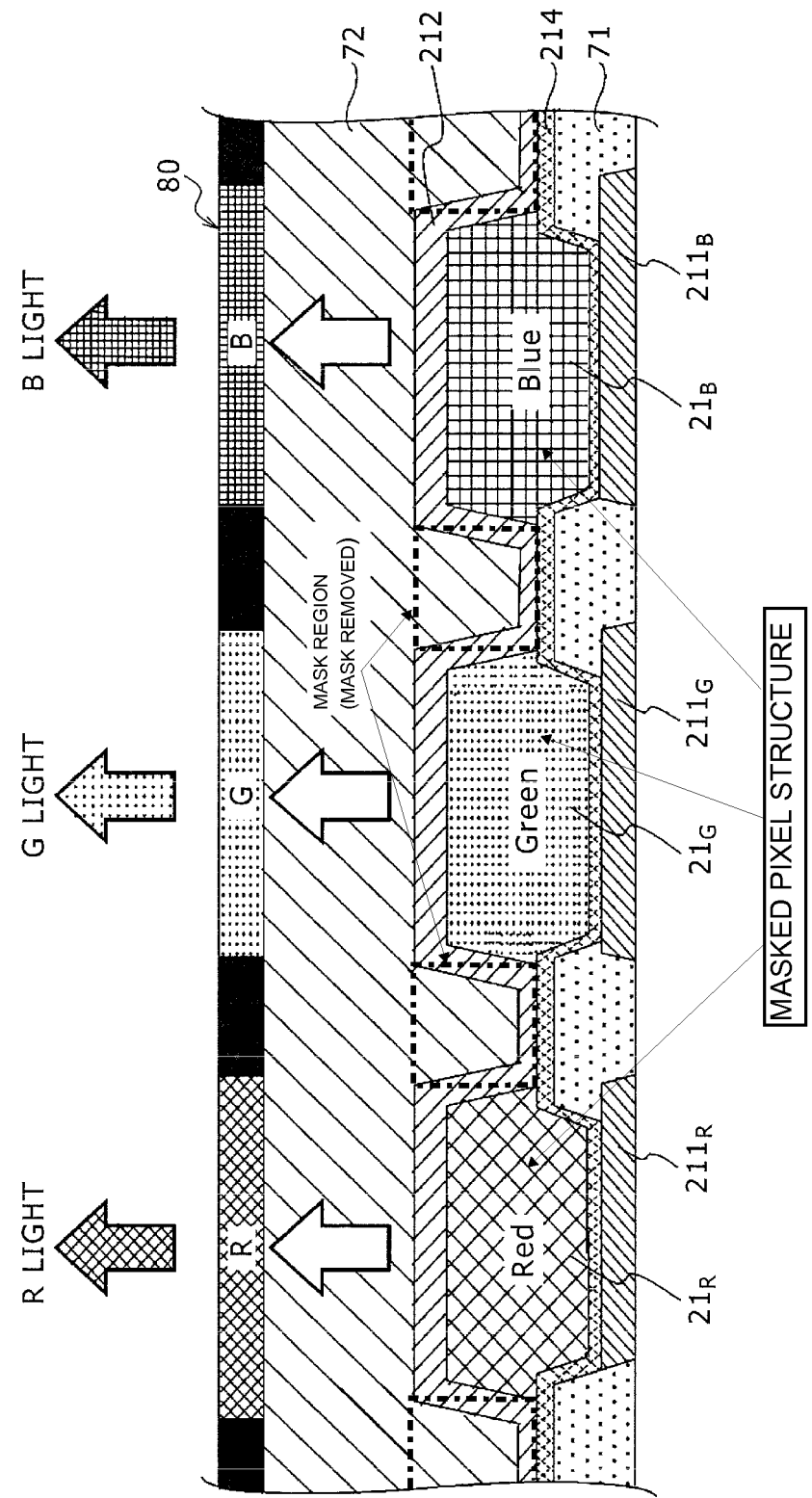
FIG. 14 is a sectional view of the major part showing one example of a pixel structure employing an RGB mask separate-application system.

Referring to FIG. 14, the charge injection layer 214 is formed as a common layer on the anode electrodes 211$_R$, 211$_G$, and 211$_B$ formed on a pixel-by-pixel basis and the window insulating film 71, and organic EL elements 21$_R$, 21$_G$, and 21$_B$ of R, G, and B are formed on the charge injection layer 214. Furthermore, the cathode electrode 212 is formed on the organic EL elements 21$_R$, 21$_G$, and 21$_B$ in common to all pixels, and the color filter 80 is formed in an on-chip form over the cathode electrode 212 with the intermediary of the interlayer insulating film 72.

In the case of the pixel structure employing the RGB mask separate-application system, the organic EL elements $21_R$, $21_G$, and $21_B$ of R, G, and B themselves emit the respective color light beams. Therefore, originally the color filter 80 is unnecessary. However, using the color filter 80 in combination provides an advantage that the color purity can be enhanced.

Also in the pixel structure employing the above-described RGB mask separate-application system, because of the existence of a common layer common to the pixels, specifically the charge injection layer 214 in the present example, the occurrence of the problem associated with a leakage current flowing into an adjacent pixel through this charge injection layer 214 is inevitable. Therefore, the above-described embodiment can be similarly applied also to a pixel structure that employs the RGB mask separate-application system and has a common layer among the pixels.

Specifically, in the pixel structure employing the RGB mask separate-application system shown in FIG. 14, a metal interconnect electrically connected to the organic layer (charge injection layer 214) is so formed as to surround the periphery of the anode electrodes $211_R$, $211_G$, and $211_B$. In addition, the potential of this metal interconnect is set to a potential lower than the potentials of the anode electrodes $211_R$, $211_G$, and $211_B$ in the non-light-emission state of the organic EL elements $21_R$, $21_G$, and $21_B$. Thereby, operation and effect similar to those of the above-described embodiment can be achieved.

4. Electronic Apparatus

The organic EL display device according to the above-described embodiment of the present disclosure can be applied to a display section (display device) of electronic apparatus in every field that displays a video signal input to the electronic apparatus or a video signal generated in the electronic apparatus as image or video. As one example, embodiments of the present disclosure can be applied to display sections of various pieces of electronic apparatus shown in FIG. 15 to FIG. 19G, specifically e.g. digital camera, notebook personal computer, portable terminal device such as a cellular phone, and video camcorder.

By using the organic EL display device according to one embodiment of the present disclosure as the display section of electronic apparatus in every field in this manner, the display quality of various kinds of electronic apparatus can be enhanced. Specifically, as is apparent from the explanation of the above-described embodiment, the organic EL display device according to one embodiment of the present disclosure can suppress light emission in an adjacent pixel even when a leakage current flows in the lateral direction through a common layer in an organic layer, and thus can achieve favorable color reproducibility (color purity). As a result, favorable displayed images having high quality can be achieved in various kinds of electronic apparatus.

The display device according to one embodiment of the present disclosure includes also a display device having a module shape based on a sealed configuration. As one example, a display module formed by applying an opposed section such as transparent glass to a pixel array section corresponds to such a display device. The display module may be provided with a circuit section, a flexible printed circuit (FPC), etc. for input/output of a signal and so forth from the external to the pixel array section.

Specific examples of the electronic apparatus to which one embodiment of the present disclosure is applied will be described below.

Figure 15:
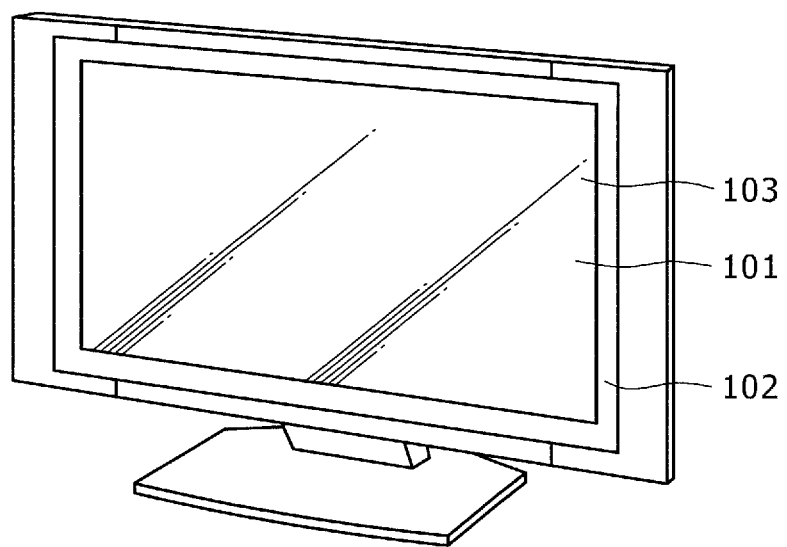
FIG. 15 is a perspective view showing the appearance of a television set to which one embodiment of the present disclosure is applied.

FIG. 15 is a perspective view showing the appearance of a television set to which one embodiment of the present disclosure is applied. The television set according to the present application example includes a video display screen section 101 composed of a front panel 102, a filter glass 103, etc. and is fabricated by using the organic EL display device according to one embodiment of the present disclosure as the video display screen section 101.

Figure 16A:
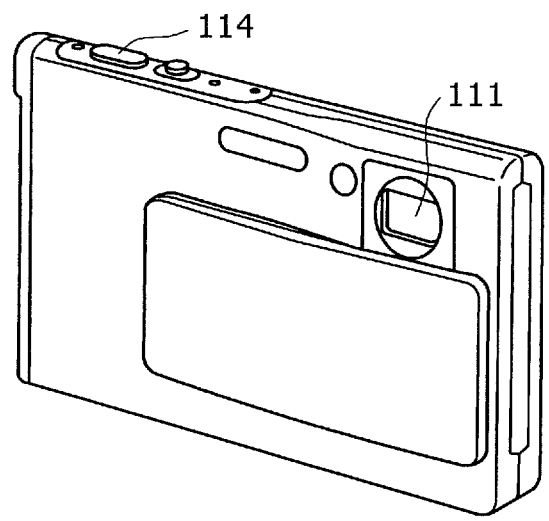
FIGS. 16A and 16B are perspective views showing the appearance of a digital camera to which one embodiment of the present disclosure is applied.
Figure 16B:
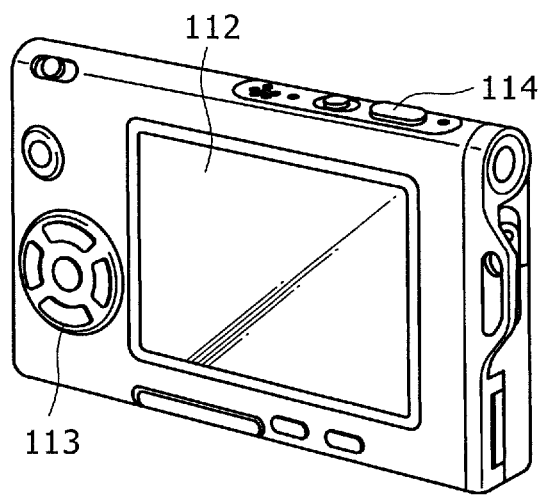

FIG. 16 is a perspective view showing the appearance of a digital camera to which one embodiment of the present disclosure is applied. FIG. 16A is a perspective view of the front side and FIG. 16B is a perspective view of the back side. The digital camera according to the present application example includes a light emitter 111 for flash, a display section 112, a menu switch 113, a shutter button 114, etc. and is fabricated by using the organic EL display device according to one embodiment of the present disclosure as the display section 112.

Figure 17:
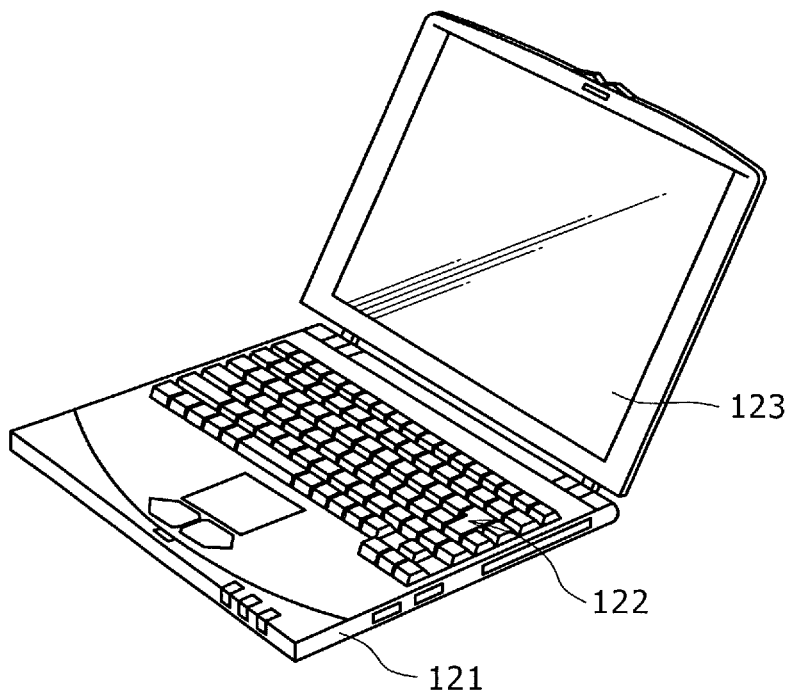
FIG. 17 is a perspective view showing the appearance of a notebook personal computer to which one embodiment of the present disclosure is applied.

FIG. 17 is a perspective view showing the appearance of a notebook personal computer to which one embodiment of the present disclosure is applied. The notebook personal computer according to the present application example includes, in its main body 121, a keyboard 122 operated when characters and so forth are input, a display section 123 that displays images, etc. and is fabricated by using the organic EL display device according to one embodiment of the present disclosure as the display section 123.

Figure 18:
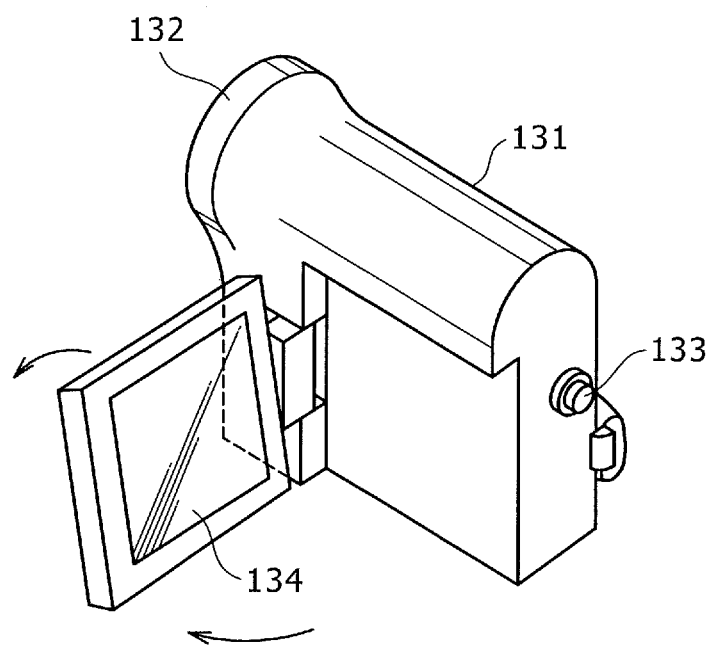
FIG. 18 is a perspective view showing the appearance of a video camcorder to which one embodiment of the present disclosure is applied.

FIG. 18 is a perspective view showing the appearance of a video camcorder to which one embodiment of the present disclosure is applied. The video camcorder according to the present application example includes a main body section 131, a lens 132 that exists on the front side and is used for subject photographing, a start/stop switch 133 operated in photographing, a display section 134, etc. and is fabricated by using the organic EL display device according to one embodiment of the present disclosure as the display section 134.

FIGS. 19A to 19G are appearance diagrams showing a cellular phone as an example of a portable terminal device to which one embodiment of the present disclosure is applied: FIG. 19A is a front view of the opened state, FIG. 19B is a side view of the opened state, FIG. 19C is a front view of the closed state, FIG. 19D is a left side view, FIG. 19E is a right side view, FIG. 19F is a top view, and FIG. 19G is a bottom view. The cellular phone according to the present application example includes an upper chassis 141, a lower chassis 142, a connecting part (in this example, hinge part) 143, a display 144, a sub-display 145, a picture light 146, a camera 147, etc. The cellular phone according to the present application example is fabricated by using the organic EL display device according to one embodiment of the present disclosure as the display 144 and the sub-display 145.

The present disclosure contains subject matter related to that disclosed in Japanese Priority Patent Application JP 2011-013049 filed in the Japan Patent Office on Jan. 25, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. An organic electroluminescence display device comprising:
   a plurality of pixels arranged in a matrix, each of the plurality of pixels including an organic electroluminescence element comprising an organic layer interposed between an anode electrode and a cathode electrode, where the organic layer of the organic electroluminescence element of each of the plurality of pixels comprises one or more constituent-layers;
   a driving section configured to selectively drive the plurality of pixels to emit light;

metal interconnects corresponding respectively to the plurality of pixels, each of the metal interconnects being configured so as to encircle an anode region of its corresponding pixel and being directly electrically connected to the organic layer of its corresponding pixel; and a physically-unitary common layer, portions of which comprise at least one constituent-layer of the organic layer of the organic electroluminescence element of each of the plurality of pixels, wherein the driving section is configured to apply a first potential to the cathode electrode of each of the plurality of pixels when the respective pixels are driven to emit light and to apply a second potential to each of the metal interconnects, where the second potential is such that the organic electroluminescence element of a given pixel of the plurality of pixels does not emit light when the second potential is applied to the anode electrode of the given pixel while the first potential is applied to the cathode electrode of the given pixel.

2. The organic electroluminescence display device according to claim 1,
wherein the organic electroluminescence element of each of the plurality of pixels is configured to emit white light, and
the organic electroluminescence display device includes a color filter that produces light of a plurality of colors from the white light emitted by the plurality of pixels.

3. The organic electroluminescence display device according to claim 2,
wherein the organic electroluminescence element of each of the plurality of pixels has a tandem structure, where the tandem structure comprises a plurality of light emitting units that emit non-white light coupled a series manner with a connecting layer between adjacent light emitting units.

4. The organic electroluminescence display device according to claim 3,
wherein said at least one constituent-layer of the organic layer of the organic electroluminescence element of each of the plurality of pixels that is part of the physically-unitary common layer is a charge injection layer that injects a charge to a light emitting layer included in the organic layer of the respective pixel.

5. The organic electroluminescence display device according to claim 4,
wherein each of the metal interconnects is directly electrically connected to the charge injection layer of its corresponding pixel via a contact hole formed in a window insulating film over which the organic electroluminescence element is provided.

6. The organic electroluminescence display device according to claim 3,
wherein said at least one constituent-layer of the organic layer of the organic electroluminescence element of each of the plurality of pixels that is part of the physically-unitary common layer is the connecting layer.

7. The organic electroluminescence display device according to claim 1,
wherein each of the metal interconnects is formed at the same layer as a layer of the anode electrode of each of the plurality of pixels.

8. The organic electroluminescence display device according to claim 1,
wherein each of the metal interconnects is formed by the same material as a material of the anode electrode of each of the plurality of pixels.

9. The organic electroluminescence display device according to claim 1,
wherein the second potential is the same as the first potential.

10. The organic electroluminescence display device according to claim 1,
wherein the organic electroluminescence element of each of the plurality of pixels has a masked structure in which at least some of the constituent layers of the respective organic electroluminescence element are physically separated from at least some of the constituent layers of every other organic electroluminescence element, and
said at least one constituent-layer of the organic layer of the organic electroluminescence element of each of the plurality of pixels that is part of the physically-unitary common layer is a charge injection layer that injects a charge to a light emitting layer included in the organic layer of the respective pixel.

11. The organic electroluminescence display device according to claim 1,
wherein the metal interconnects are connected one to another so as to form a physically unitary lattice structure.

12. An electronic apparatus having the organic electroluminescence display device of claim 1.

13. An organic electroluminescence display device comprising:
a plurality of pixels arranged in a matrix, each of the plurality of pixels including an organic electroluminescence element comprising an organic layer interposed between an anode electrode and a cathode electrode, where the organic layer of the organic electroluminescence element of each of the plurality of pixels comprises one or more constituent-layers;
a driving section configured to selectively drive the plurality of pixels to emit light;
a physically-unitary common layer, portions of which comprise at least one constituent-layer of the organic layer of the organic electroluminescence element of each of the plurality of pixels,
metal interconnects corresponding respectively to the plurality of pixels, each of the metal interconnects being configured so as to encircle an anode region of its corresponding pixel and being directly electrically connected to the physically-unitary common layer; and
wherein the driving section is configured to apply a first potential to the cathode electrode of each of the plurality of pixels when the respective pixels are driven to emit light and to apply a second potential to each of the metal interconnects, where the second potential is such that the organic electroluminescence element of a given pixel of the plurality of pixels does not emit light when the second potential is applied to the anode electrode of the given pixel while the first potential is applied to the cathode electrode of the given pixel.

* * * * *